(12) United States Patent
Murahashi et al.

(10) Patent No.: US 6,853,430 B2
(45) Date of Patent: Feb. 8, 2005

(54) DISPLAY ELEMENT DRIVING APPARATUS AND DISPLAY USING THE SAME

(75) Inventors: Syunichi Murahashi, Nabari (JP); Masafumi Katsutani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 123 days.

(21) Appl. No.: 10/066,632

(22) Filed: Feb. 6, 2002

(65) Prior Publication Data
US 2002/0109814 A1 Aug. 15, 2002

(30) Foreign Application Priority Data

Feb. 13, 2001 (JP) ........................................ 2001-036080

(51) Int. Cl.[7] ............................................. G02F 1/1345
(52) U.S. Cl. ........................................................ 349/150
(58) Field of Search ................................ 349/149, 150, 349/151, 152

(56) References Cited

U.S. PATENT DOCUMENTS 6,380,919 B1 * 4/2002 Koyama et al.

FOREIGN PATENT DOCUMENTS

| JP | 05297399 A | * 11/1993 | ......... G02F/1/1345 |
| JP | 06-011721 | 1/1994 | |
| JP | 06-034987 | 2/1994 | |
| JP | 09288279 A | * 11/1997 | ......... G02F/1/1345 |
| JP | 2000294897 A | * 10/2000 | ............ H05K/1/18 |
| JP | 2002-189229 A | 7/2002 | |

OTHER PUBLICATIONS

Japan Office Action, Ref. No. 00J05325, Mailing No. 262170, mailed Jul. 20, 2004 (w/English translation).

* cited by examiner

Primary Examiner—Kenneth Parker
(74) Attorney, Agent, or Firm—Birch, Stewart, Kolasch & Birch, LLP

(57) ABSTRACT

A liquid crystal panel includes a plurality of a data line electrode and a plurality of a scanning line electrode crossing each other and forming a pixel arranged in a matrix at the intersection of these two. A mounting package is connected to an edge of a side of a glass substrate of the liquid crystal panel. On an insulating film base of the mounting package, an LSI chip for driving the data line electrode and an LSI chip for driving the scanning line electrode are mounted. The former LSI chip is provided to be close to the liquid crystal panel compared to the latter. A set of wires connecting a group of connecting terminals to the LSI chip is fixed on the film base so as to pass under the LSI chip (mounting area) on the film base. On this account, it is possible to provide a set of wires, which is not connected to the drive LSI chip, in the shortest distance without disconnecting the same, in an arrangement in which a plurality of drive LSI chips is mounted on the liquid crystal panel etc.

30 Claims, 20 Drawing Sheets

US 6,853,430 B2

DISPLAY ELEMENT DRIVING APPARATUS AND DISPLAY USING THE SAME

FIELD OF THE INVENTION

The present invention relates to a display element driving apparatus including an integrated circuit mounted on a mounting substrate connected to the display element, into which drive circuits for driving a display element such as a liquid crystal display element are integrated, and a display including the same.

BACKGROUND OF THE INVENTION

A matrix-type liquid crystal display panel conventionally has a structure shown in FIG. 13. To be more specific, this liquid crystal display panel includes a group 101 of scanning line electrodes, a group 102 of data line electrodes, and a liquid crystal (not illustrated) sandwiched between the groups 101 and 102. The group 101 of scanning line electrodes is made up of scanning line electrodes X1 to Xm provided sidewards and being in parallel with each other. Meanwhile, the group 102 of data line electrodes is made up of data line electrodes Y1 to Yn provided longitudinally and being in parallel with each other, and also crossing the scanning line electrodes X1 to Xm at right angles. Moreover, a pixel P is formed at the intersection of a scanning electrode Xi (m=i) and a data line electrode Yj (n=j).

For instance, typical driving method of this kind of liquid crystal display panel is explained in publications including Japanese Laid-Open Patent Application No. 60-222835/1985 (Tokukaisho 60-222835; published on Nov. 7, 1985) titled "Driving Method of Liquid Crystal Matrix Display Panel" and Japanese Laid-Open Patent Application No. 62-3229/1987 (Tokukaisho 62-3229; published on Jan. 9, 1987) titled "Liquid Crystal Driving Method". These driving methods apply a voltage sufficient to alter an optical characteristic (transparency) of liquid crystal of the pixel by transmitting a signal to the pixel via the scanning line electrode and data line electrode, when the liquid crystal of the pixel is addressed. Matrix-type liquid crystal displays applying a voltage to a pixel have this kind of addressing method in common, regardless of the types of the panels such as TFT (Thin Film Transistor) and STN (Super Twisted Nematic).

As the driving methods above show, transmitting the scanning signal and the data signal to the pixel is necessary for driving the matrix-type liquid crystal display panel. Thus as FIGS. 14 and 15 show, the liquid crystal display panel 111 is conventionally arranged so that an LSI chip 112 for driving data lines (hereinafter, will be simply referred to as data LSI chip) is provided on a side of a display area 111b formed on a glass substrate 111a of a liquid crystal panel 111, whereas an LSI chip 113 for driving scanning lines (hereinafter, will be simply referred to as scanning LSI chip) is provided on another side of the liquid crystal panel 111.

In the arrangement shown in FIG. 14, a TCP (Tape Career Package) 114 on which the data LSI chip 112 ("LSI Chip" in the figure) is mounted and a TCP 115 on which the scanning LSI chip 113 ("LSI Chip" in the figure) is mounted are connected to the glass substrate 111a on which electrodes are provided.

In the arrangement shown in FIG. 15, the LSI chips 112 and 113 are directly mounted on the glass substrate 111a by a method termed COG (Chip On Glass). Moreover, a flexible printed board 116, for transmitting a control signal and applying a supply voltage to the LSI chips 112 and 113, is connected to the glass substrate 111a.

There is another arrangement such that, as shown in FIG. 16, a TCP 118 on which a single LSI chip 117 ("LSI Chip" in the figure) is mounted is connected to a side of the glass substrate 111a (see Japanese Laid-Open Patent Application No. 6-34987/1994 (Tokukaihei 6-34987; published on Feb. 10, 1994)). In the LSI chip 117, driving circuits generating the data signal and the scanning signal are integrated altogether.

There is a further arrangement such that, as FIG. 17 shows, two scanning LSI chips 113 are provided on opposing sides of the data LSI chip 112 and on the TCP 119, and the TCP 119 is connected to a side of the glass substrate 111a (see Japanese Laid-Open Patent Application No. 6-34987/1994 (Tokukaihei 6-34987; published on Feb. 10, 1994) and Japanese Laid-Open Patent Application No. 6-11721/1994 (Tokukaihei 6-11721; published on Jan. 21, 1994)). In this arrangement the display area 111b is provided on the center of the glass substrate 111a so that sets of wires for the scanning electrodes, which extend from the TCP 119 to the display area 111b, are separately provided on both sides of the display area 111b. On this account, two scanning LSI chips 113 are provided.

However, the conventional arrangements shown in FIGS. 14 and 15 require to provide two LSI chips 112 and 113 for generating a driving signal on at least two sides of the liquid crystal panel 111. Thus as FIG. 14 shows, at least TCPs 114 and 115 on which the chips above are mounted are required so that the arrangements should be complicated and demand greater numbers of the parts accordingly. Therefore this type of arrangement costs a lot.

When the COG technique shown in FIG. 15 is employed, it is required that the data LSI chip 112 and the scanning LSI chip 113 are mounted on at least two sides of the glass substrate 111a. In this arrangement the center of the glass substrate 111a and that of the display area 111b are not matched when actually mounted so that a non-display area (frame) surrounding the display area 111b has to be broad, to match the center of a device, on which the liquid crystal panel 111 is mounted, with the center of the display area 111b.

For instance, as FIG. 18 shows, a non-mounting part of the non-display area of the glass substrate 111a, on which the LSI chips 112 and 113 are not mounted, is not necessarily broad, whereas a mounting part of the non-display area, on which the LSI chips 112 and 113 are mounted, has to be broad. More specifically, when the width of the mounting part is 5 mm while that of the non-mounting part is 1 mm and the distance between the edge of the glass substrate 111a and a housing 121 storing the liquid crystal panel 111 is 1 mm, the distance between the edge of the display area 111b and an interior wall of the housing 121 is 6 mm on the mounting part side, whereas the distance above is 2 mm on the non-mounting part side.

When the arrangement shown in FIG. 15 is manufactured in accordance with the dimensions given above, a device on which the liquid crystal panel 111 is mounted includes, as FIG. 18 shows, the display area 111b provided on the right-hand side of the housing 121. Although it depends on the shape of a device, generally the device looks good when the center of the display area 111a is at an equal distance from both right and left edges of the housing 121. (Directions such as above, below, right, and left mentioned in this description are defined as those for a viewer of the display.) On this account, to form the housing 121 symmetrically, it is required to set both of distances between the right edge of the display area 111b and the interior wall of the housing 121 and between the left edge thereof and the interior wall thereof to 6 mm. However, the sideward length of this housing 121 is unnecessarily long.

The problem of the aforementioned COG arrangement does not much matter for a conventional device using the TCP, since the film can be bent by providing a slit thereon. However, even in the arrangement shown in FIG. 14, an area having around 2 mm width is required to connect the TCPs 114 and 115 to the glass substrate 111a so that a similar inconvenience occurs when forming the housing 121, even though the inconvenience is less prominent than the case of the COG.

The arrangement shown in FIG. 16 requires to include all circuits for driving the liquid crystal panel 111 in the LSI chip 117. For instance, when a color liquid crystal panel including 128×164 pixels is driven, 128×3 (R, G, B) data line electrodes and 164 scanning line electrodes are required so that the LSI chip 117 has to have 548 driving terminals in total.

There can be another arrangement so that the data line electrodes are separately provided above and below the display area 111b and hence the liquid crystal panel 111 is driven by two LSI chips respectively provided on the upper and lower sides of the glass substrate 111a. In this arrangement, each of the upper and lower LSI chips has 128×3 data line electrodes and 82 scanning line electrodes and hence each of the two LSI chips has to have 466 driving terminals in total.

However, cost of an LSI chip including a lot of driving circuits and corresponding terminals is expensive, since the chip is large in size so that only a small number of the chips can be manufactured from one wafer.

Moreover, generally a voltage sufficient to alter an optical characteristic (transparency) of a liquid crystal material is around 10V as an effective voltage. However, a voltage applied to a liquid crystal is normally converted to alternate current to keep reliability of the liquid crystal material. On this account, around a ±10V (or 20V in amplitude) driving voltage may be required in reality, depending on a driving method.

Compared with a conventional LSI manufacturing process for manufacturing a low-voltage-driven circuit (around 5V) such as a logic circuit, a manufacturing process to manufacture a high-voltage-driven circuit (such as 20V) requires high cost and also the LSI chip thereof has to be large in area to endure a high voltage.

Some driving methods etc. allow to set a voltage applied to a chip for numerous data line electrodes low. In this case the LSI chip for the data line electrodes can be manufactured in a conventional process for manufacturing a logic circuit etc. When this kind of LSI chip is employed for the data line electrodes, a voltage driving liquid crystal is insufficient since a driving voltage of a circuit manufactured in the conventional LSI manufacturing process is roughly between 0V and 5V. Thus the liquid crystal driving voltage has to be supplemented by increasing a driving voltage applied to scanning electrodes. On this account, only the LSI chip for the scanning electrodes is manufactured in the process to manufacture the expensive LSI capable of enduring a high voltage, so that it is possible to reduce a total cost for the driving device.

However, as FIG. 16 shows, the arrangement employing a single LSI chip 117 cannot divide the LSI chip into the chip for the data line electrodes and that for the scanning line electrodes. On this account, the LSI chip 117 has to be manufactured in the process to manufacture the expensive LSI capable of enduring a high voltage, so that it is not possible to reduce the cost of the LSI chip 117.

In the meantime, in the arrangement shown in FIG. 17 two scanning LSI chips 113 are provided on the TCP 119 and hence the data LSI chip 112 and two scanning LSI chips 113 can be manufactured in each different LSI manufacturing process. Thus costs for the LSI chip can be reduced in this arrangement, compared to the arrangement shown in FIG. 16. However, including two scanning LSI chips 113 makes it necessary to transmit the control signal for driving scanning lines, which is input from the outside, from both groups of terminals respectively provided on both sides of the connecting terminals 119a of the TCP 119. Thus an arrangement of a surrounding part of the TCP 119 has to be complex and the number of required parts as a driving device is increased, so that the cost is expensive.

As FIG. 20 shows, an arrangement below is employed when a drive LSI chip 132 for driving is mounted on a TCP 131. This TCP 131 includes leads 133 for transmitting signals fixed on an insulating film base 134 via an adhesive layer 135. The LSI chip 132 is attached to the leads 133 by fixing bumps 136, provided on a mounting surface of the LSI chip 132, to the leads 133. The leads 133 forming a wiring layer is protected with a protector 136 made up of a solder resist etc. Also the LSI chip 132 and the leads 133 are protected with a resin layer 137.

The TCP 131 arranged as above includes the film base 134 to which an adhesive for forming the adhesive layer 135 is applied in advance, and through which a device hole 131a as a space for mounting the LSI chip 132 is formed. Then a conductive material such as a copper film is pasted on the film base 134, and wires including the leads 133 is formed by etching the conductive material. The TCP 131 arranged as above has an advantage so that the leads 133 can be easily aligned with the bumps 136, since the leads 133 are provided as jutting into the device hole 131a.

However, the above-arranged TCP 131 has a disadvantage so that it is impossible to provide any wires except the ones connected to the LSI chip 132 in the area where the LSI chip 132 is provided, due to the existence of the device hole 131a. A material used for the leads 133 (wire) is a conductive material such as a copper film sized around 20 µm thick and 40 µm wide, so as to be disconnected easily. Therefore even if one tries to mount the LSI chip 132 in the device hole 131a in which no film base is provided by leaving only the wires, the wires are easily disconnected by stress generated in the process of mounting the LSI chip 132.

Moreover, stress is generated due to an injection of a resin material into the device hole 131a when the resin layer 137 is formed. So the wires not fixed on the film base 134 are pushed away owing to the stress so as to be short-circuited with other wires or the bumps 136 formed on the LSI chip 132. Incidentally, the thickness of the film base 134 is around 75 µm.

SUMMARY OF THE INVENTION

The present invention aims at providing:
a display element driving apparatus in which a set of
   wires, which is not connected to a drive LSI chip
   (integrated circuit), can be provided in the shortest
   distance without disconnecting the same; and
a display using the same,
in which a plurality of drive LSI chips is mounted on a liquid crystal panel etc.

To achieve this aim, the display element driving apparatus of the present invention and a display element integrated circuit of the display using the apparatus includes:

first and second integrated circuits for driving a display element having a plurality of first electrodes and a plurality of second electrodes which cross each other in a matrix manner, the first integrated circuit including a chip into which a first drive circuit for driving the first electrodes, and the second integrated circuit including a chip into which a second drive circuit for driving the second electrodes; and a single mounting substrate, including connecting terminals and connecting wires which connect the connecting wires which connect the connecting terminals and the first integrated circuit, for mounting the first and second integrated circuits such that the first integrated circuit is closer to the display element than the second integrated circuit between the connecting terminals and the display element, wherein the connecting wires are fixed in the substrate so as to pass through an mounting area of the second integrated circuit.

According to this arrangement, the first integrated circuit is provided to be relatively close to the display element whereas the second integrated circuit is provided to be relatively far from the display element, between the connecting terminals and the display element on the single mounting substrate. Thus it is necessary to provide the first and second integrated circuits close to each other, if one tries to reduce the area of the mounting substrate.

In this type of arrangement the shortest path for the connecting wires to connect the connecting terminals to the first integrated circuit is blocked by the second integrated circuit. However, the connecting wires are provided to pass through the mounting area for the second integrated circuit so that the connecting wires do not have to avoid the mounting area. Thus it is possible to provide the connecting wires in the shortest distance and hence the area of the mounting substrate can be reduced. Moreover, the connecting wires are fixed on the mounting substrate so that the wires are not disconnected on account of stress generated in a process of mounting the second integrated circuit on the mounting substrate. Therefore it is possible to cut the cost of the display element driving apparatus.

For a fuller understanding of the nature and advantages of the invention, reference should be made to the ensuing detailed description taken in conjunction with the accompanying drawings.

BRIEF DESCRIPTION OF THE DRAWINGS

FIG. 3(a) is a side view showing an arrangement of a mounting package, which is shared between all embodiments of the present invention, in which leads are provided below an LSI chip for driving a scanning line electrode, whereas FIG. 3(b) is a plan view showing the arrangement from a film base side.

DESCRIPTION OF THE EMBODIMENTS

The following description will discuss an embodiment in accordance with the present invention in reference to FIGS. 1 to 11.

Figure 2:
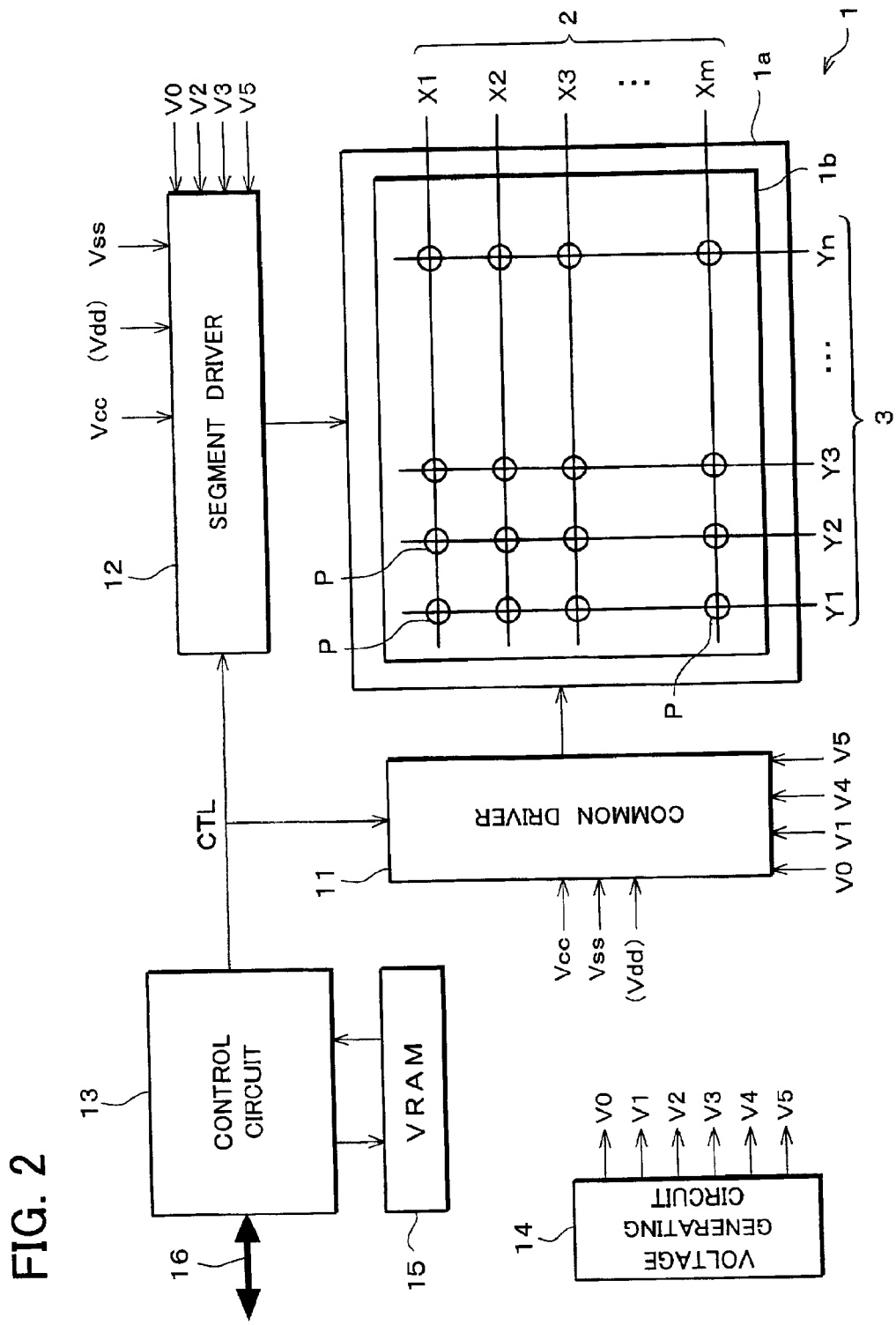
FIG. 2 is a block diagram showing an arrangement of the liquid crystal module which is shared between all embodiments of the present invention.
Figure 3:
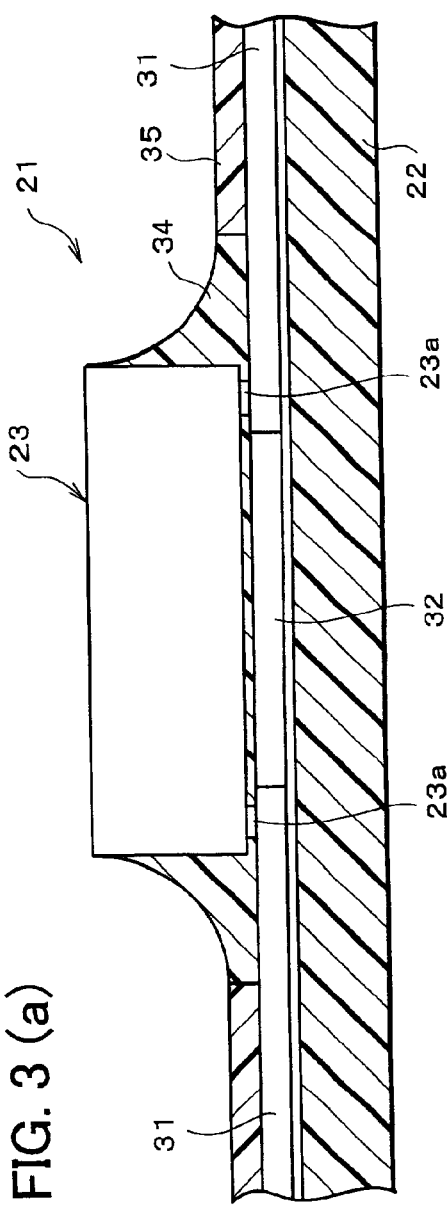
Figure 3:
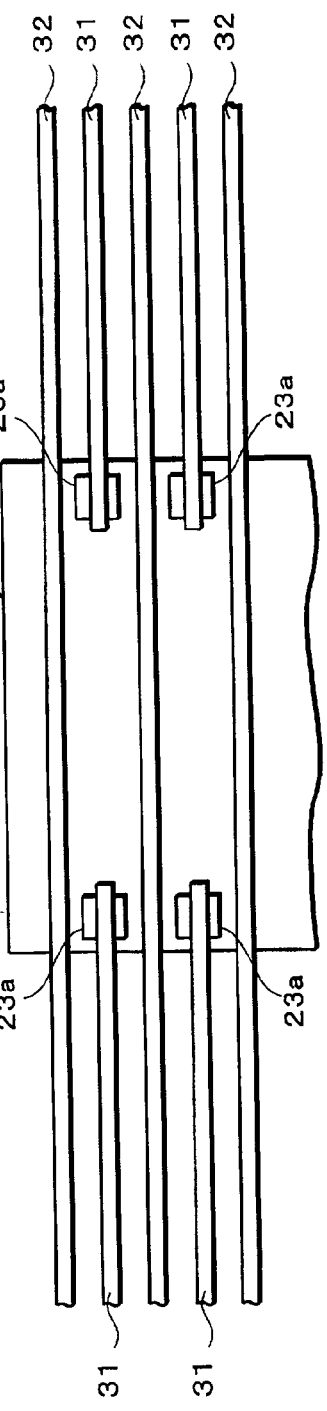

As FIG. 2 shows, a liquid crystal module in accordance with the present invention includes a liquid crystal panel 1, surrounding circuits (described later) and so forth.

The liquid crystal panel 1 as a display element is a general STN liquid crystal panel, including a group 2 of scanning line electrodes, a group 3 of data line electrodes, and a liquid crystal (not illustrated) sandwiched between the groups 2 and 3 which are arranged in a matrix manner. The group 2 of scanning line electrodes is made up of scanning line electrodes X1 to Xn provided sidewards and being, in parallel with each other. Meanwhile, the group 3 of data line electrodes is made up of data line electrodes Y1 to Yn provided longitudinally, crossing the scanning line electrodes X1 to Xn at right angles and being in parallel with each other. Moreover, a pixel P is formed at the intersection of the scanning electrode Xi (m=i) and the data line electrode Yj (n=j). The pixels P are provided within a display area 1a of the liquid crystal display 1 in a matrix manner.

A scanning line electrode driving circuit 11 (hereinafter, will be simply referred to as common driver) and a data line electrode driving circuit 12 (hereinafter, will be simply referred to as segment driver) are connected to the liquid crystal panel 1. Moreover, a control circuit 13 and a voltage generating circuit 14 are connected to the common driver 11 and the segment driver 12. A scanning signal for selecting which scanning line electrodes X1 to Xm are driven is transmitted from the common driver 11 to the group 2 of scanning line electrodes. In the meantime, a data signal in accordance with data for display is transmitted from the segment driver 12 to the group 3 of data line electrodes.

The control circuit 13 receives the data for display from a VRAM 15 storing the data for display, and provides a control signal CTL for controlling display to the drivers 11 and 12 in accordance with an external instruction transmitted via a system bus 16. The control signal provided to the segment driver 12 includes the data for display.

The voltage generating circuit 14 generates 6 different types of voltages V0 to V5 for display. The circuit 14 provides the voltages V0, V1, V4, and V5 to the common driver 11 and the voltages V0, V2, V3, and V5 to the segment driver 12. A signal level for driving a liquid crystal is determined in accordance with these voltages V0 to V5. The definition of a waveform of a voltage for driving is omitted since the same is described in the aforementioned Japanese Laid-Open Patent Application etc.

Moreover, a supply voltage Vcc, a reference voltage Vss, and a boosted supply voltage Vdd are provided to the drivers 11 and 12. The supply voltage Vcc is a voltage (5V system) for logic driving, whereas the reference voltage Vss is a standard voltage such as a ground electric potential. The boosted source voltage Vdd is a boosted voltage for driving an output stage, and some driving methods require the same (for instance 20V).

Figure 1:
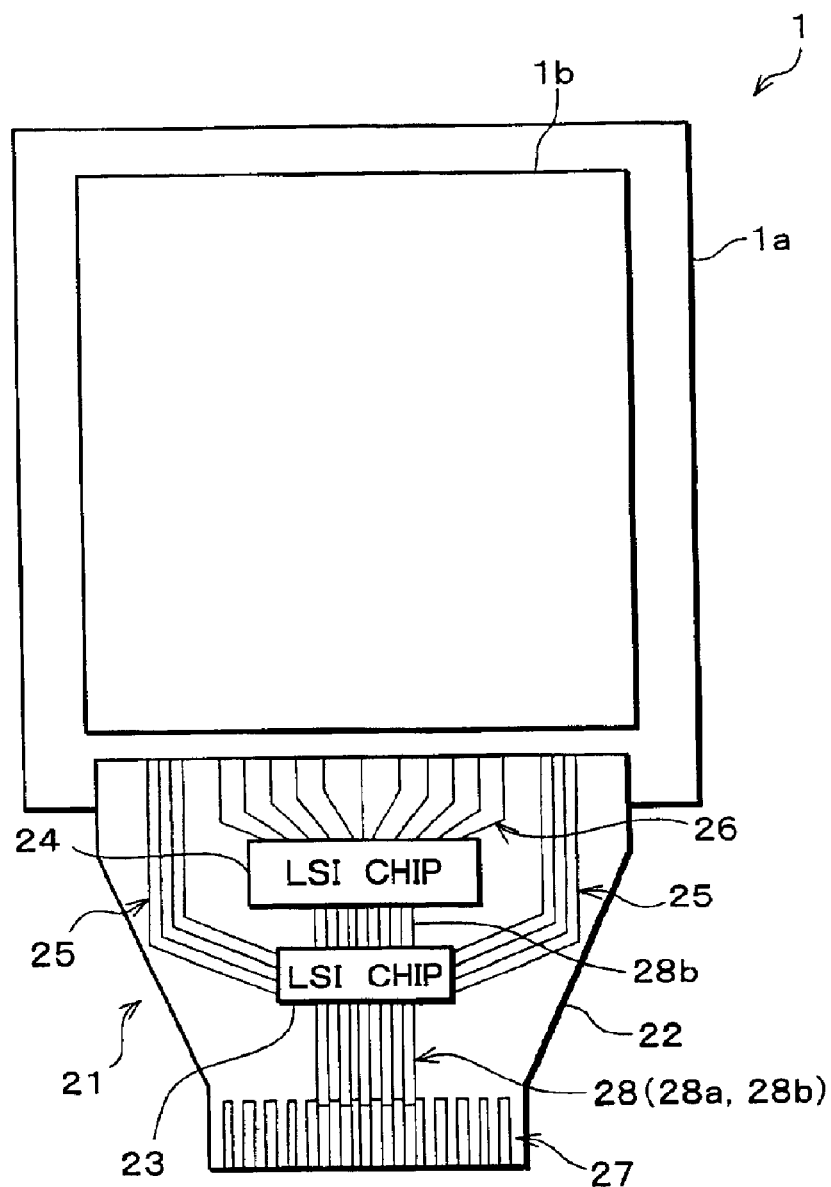
FIG. 1 is a plan view showing a liquid crystal panel and an arrangement of a mounting package attached to the same in accordance with a liquid crystal module of an embodiment of the present invention.

As FIG. 1 shows, a mounting package 21 is connected to a side of a glass substrate 1 of the liquid crystal panel 1. The mounting package 21 is a package mounting:

an LSI chip 23 (second integrated circuit) into which the common driver 11 is integrated; and an LSI chip 24 (first integrated circuit) into which the segment driver 12 is integrated, on an insulating film base 22 made of polyimide etc. using a technique termed COF (Chip On Film). An edge of this mounting package 21 is connected to ITO (Indium Tin Oxide), which is for connecting, of the liquid crystal panel 1.

On the film base 22 as a mounting substrate, an LSI chip 24 is provided on the side near the liquid crystal panel 1 whereas an LSI chip 23 is provided on the side far from the liquid crystal panel 1. The film base 22 also includes:

two sets of wires 25 for connecting the LSI chip 23 to the liquid crystal panel 1; and a set of wires 26 for connecting the LSI chip 24 to the liquid crystal panel 1.

The set of wires 26 is made up of conductive wires (copper wires) fixed on the film base 22. Meanwhile, the sets of wires 25 as output wiring, also made up of conductive wires (copper wires) fixed on the film base 22, are provided to pass by the both sides of the LSI chip 24. The film base 22 further includes a group 27 of connecting terminals provided on an edge opposite to the edge connected to the liquid crystal panel 1.

A set of wires 28 formed on the film base 22 connects the LSI chips 23 and 24 to the group 27 of connecting terminals, and this set of wires 28 is also made up of conductive wires (copper wires) fixed on the film base 22. The set of wires 28 contains a first set of wires 28a connected to the LSI chip 23 and a second set of wires 28b passing under the LSI chip 23 to be connected to the LSI chip 24, as connecting wires.

Incidentally, the second set of wires 28b may include not only wires for inputting the control signal CTL, the voltages V0, V2, V3, and V5 (for the segment driver 12), the supply voltage Vcc, the reference voltage Vss, and the boosted supply voltage Vdd, but also a wire for outputting a signal. For instance, the signal may be a start pulse signal included in the control signal CTL and transmitted in a shift register provided in the segment driver 12. A pulse signal, transmitted from each output stage of the shift register is used as a sampling signal for selecting either one of the voltages V0, V2, V3, and V5 which is matched with display data provided for the data line electrodes Y1 to Yn, during the start pulse signal is transmitted in the shift register.

After transmitted in the shift register, the start pulse signal is again transmitted from the group 27 of connecting terminals via the second set of wires 28b, to an unillustrated external controller (may be the control circuit 13) etc. This controller either terminates the transmission of the data for display in one horizontal scanning period or resets a counter of a display data output processing circuit in the controller, when detecting the start pulse signal.

Similarly, the first set of wires 28a may include not only wires for inputting the control signal CTL, the voltages V0, V1, V4, and V5 (for the common driver 11), the supply voltage Vcc, the reference voltage Vss, and the boosted supply voltage Vdd, but also a wire for outputting a signal. For instance, the signal may be a start pulse signal included in the control signal CTL and transmitted in a shift register provided in the common driver 11.

After transmitted in the shift register, the start pulse signal is again transmitted from the group 27 of connecting terminals via the first set of wires 28a, to the controller etc. This controller either terminates the transmission of the data for display in one vertical scanning period or resets the counter of the display data output processing circuit in the controller, when detecting the start pulse signal.

The film base 22 may be made up of three layers in which a multiple number of films and conductive wires are adhered via an adhesive layer, or two layers in which the films and wires are adhered by thermocompression instead of using the adhesive. The film base 22 is, for instance, around 40 $\mu$m thick while the conductive wires are around 10 $\mu$m thick and 28 $\mu$m wide.

By the way, not only the film base 22 but also a ceramic board etc. can be used as the mounting substrate.

Although not illustrated, ITO wires on the liquid crystal panel 1 and the conductive wires on the film base 22 are electrically connected and thereby fixed by thermocompression via an ACF (Anisotropic Conductive Film).

The following description will discuss an arrangement in which the set of wires 28 passes under the LSI chip 23.

As shown in FIGS. 3(a) and 3(b), in the mounting package 21, LSI chip 23 is mounted on the film base 22. LSI chip 23 is connected to leads 31 via the bumps 23a that are connecting electrodes for an external electric connection. The leads 31 as conductive wires constitute the first set of wires 28a. The LSI chip 23 and the leads 31 are protected with a resin layer 34. In this arrangement, a mounting area for the LSI chip 23 is provided on the film base 22 and the bumps 23a are aligned with the leads 31. Also, the leads 31 and leads 32 to be described later are protected with a protector 35 made up of a solder resist etc.

Figure 20:
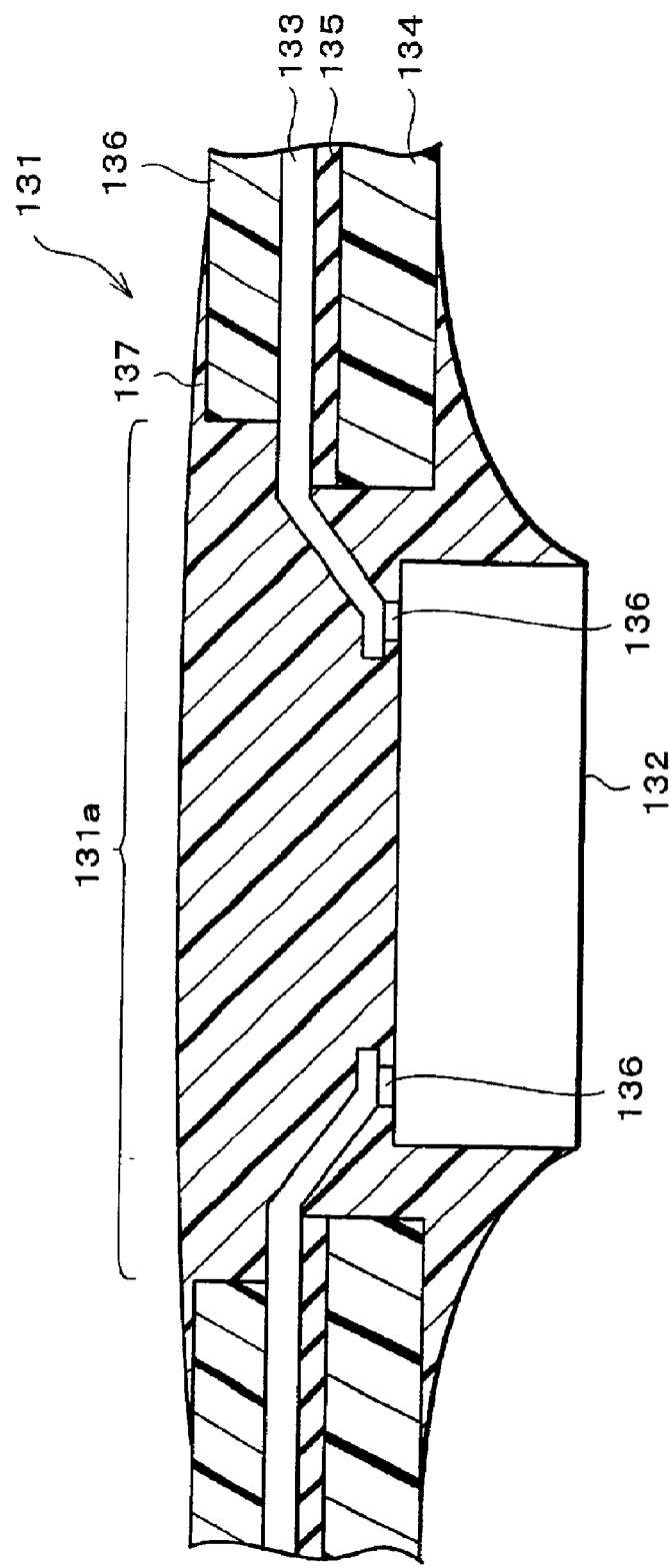
FIG. 20 is a side view showing how an LSI chip is mounted in a conventional TCP.

FIG. 3(b) shows wires on the mounting package 21 from its side facing the film base 22 without illustrating the base 22. As the figure indicates, the leads 31 are connected to the bumps 23a in the same manner as in a conventional TCP (see FIG. 20). However, the film base 22 exists below the mounted LSI chip 23 in this case. On the mounting area for the LSI chip 23 on the base 22, the leads 32 which are not connected to the LSI chip 23 are fixed. Thus the leads 32 are neither disconnected when the LSI chip 23 is mounted nor pushed away by stress generated when the resin material is injected around the LSI chip 23.

Therefore, it is possible to provide the leads 32, which is not connected to the LSI chip 23, under the LSI chip 23 (between the film base 22 and the LSI chip 23), when the mounting structure above is adopted. On this account, even if in the mounting package 21 the LSI chips 23 and 24 are mounted on the single film base 22, the leads 32 constituting the second set of wires 28b do not have to take indirect paths along the both sides of the LSI chip 23 so that the signal wires can take a simple path. Furthermore, the size of the film base 22 can be reduced and hence the cost of manufacturing the mounting package 21 can be reduced.

Two sets of wires 25 between the LSI chip 23 and the liquid crystal panel 1 are provided along the both sides of the LSI chip 24 so that the sets of wires 25 are not provided between the LSI chips 23 and 24. On this account, the second set of wires 28b is connected to the LSI chip 24 by passing under the LSI chip 23, which is the shortest path. Moreover, the size of the film base 22 can be reduced by providing the two sets of wires 25 close to the LSI chip 24 as much as possible.

In the mounting package 21 arranged as above, a substrate (not illustrated) on which the control circuit 13, the voltage generating circuit 14, a VRAM 16, etc. are mounted is connected to the group 27 of connecting terminals of the film base 22. On this account, the control signal CTL for the LSI chip 23 transmitted from the control circuit 13 is input to the group 27 of connecting terminals, and then input to the LSI chip 23 via the first set of wires 28a. Meanwhile, the control signal CTL for the LSI chip 24 transmitted from the control circuit 13 is input into the group 27 of connecting terminals, and then input to the LSI chip 24 via the second set of wires 28b passing under the LSI chip 23.

Moreover, the LSI chips 23 and 24 are separately provided so that these LSIs can be manufactured in each different process. For instance, it is possible to manufacture the LSI 24 in a common manufacturing method with low cost. Thus it is possible to cut the production cost of the LSI chip 24 and consequently cut the cost of the liquid crystal module including the liquid crystal panel 1 as well as the mounting package 21.

Figure 4:
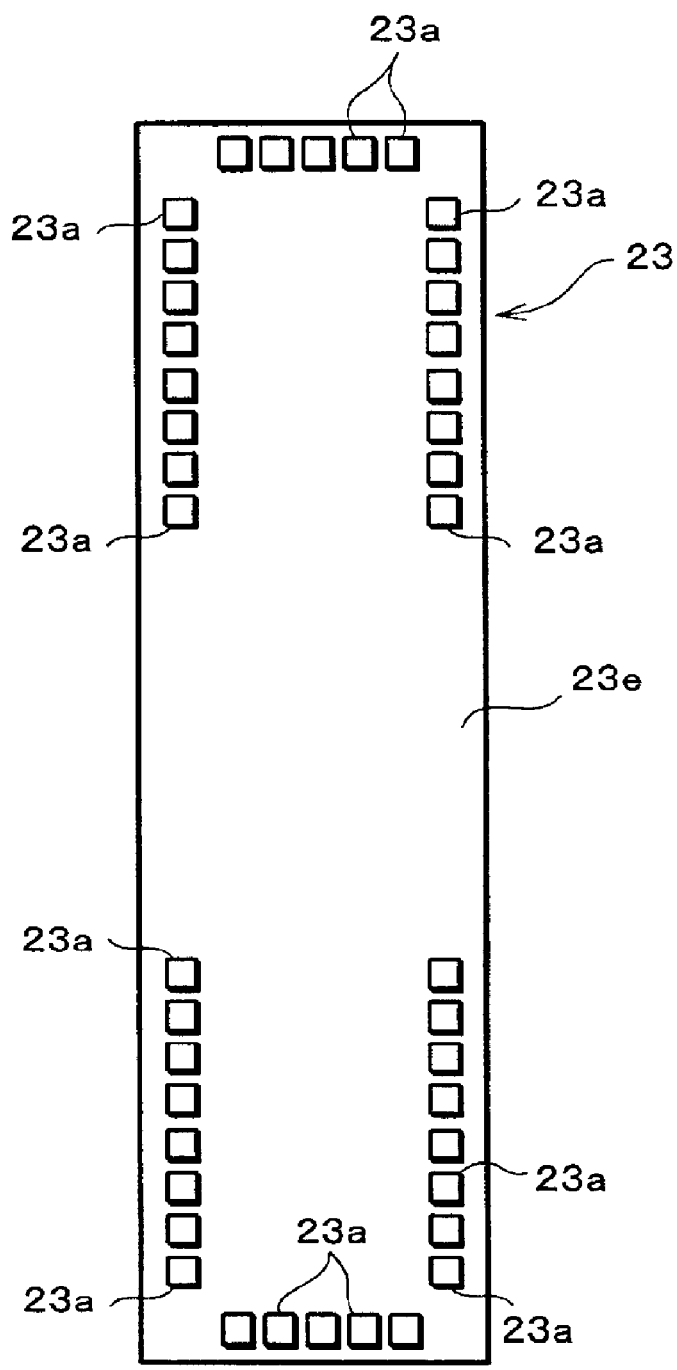
FIG. 4 is a plan view showing an arrangement of bumps on the LSI chip.

FIG. 4 shows the LSI chip 23 including the bumps 23a which are connecting electrodes on the opposing edges of the chip. More specifically, the bumps 23a are provided along the edges of a mounting face 23e (bottom face) of the LSI chip 23 facing the film base 22, except around the middle parts of the longer sides of the face 23e. On this account, a large space (passing area) across which the second set of wires 28b can pass is provided in the middle of the mounting face 23e of the LSI chip 23. Also, as shown in FIG. 3(a), the LSI chip 23 is sealed with the resin layer 34 except the top face thereof and the areas for contacting with the bumps 23a. On this account, the wires provided in the space below the LSI chip 23 do not short-circuit with other wires connected to the LSI chip 23.

Incidentally, the height of the bump 23a is around 10 μm so that the central part of the LSI chip 23, on which the bumps 23a are not formed, are hardly stressed when the LSI chip 23 is mounted, provided that the LSI chip 23 is not large in size. However, if the LSI chip 23 is large in size, the stress may be applied to the central part of the LSI chip 23 due to its long narrow shape. Moreover, when a resin is injected into the gap between the LSI chip 23 and the film base 22 to form the resin layer 34 after these two are connected, the resin may not be spread uniformly on the opposing edges of the LSI chip 23 since the bumps 23 are intensively provided thereon.

Figure 5:
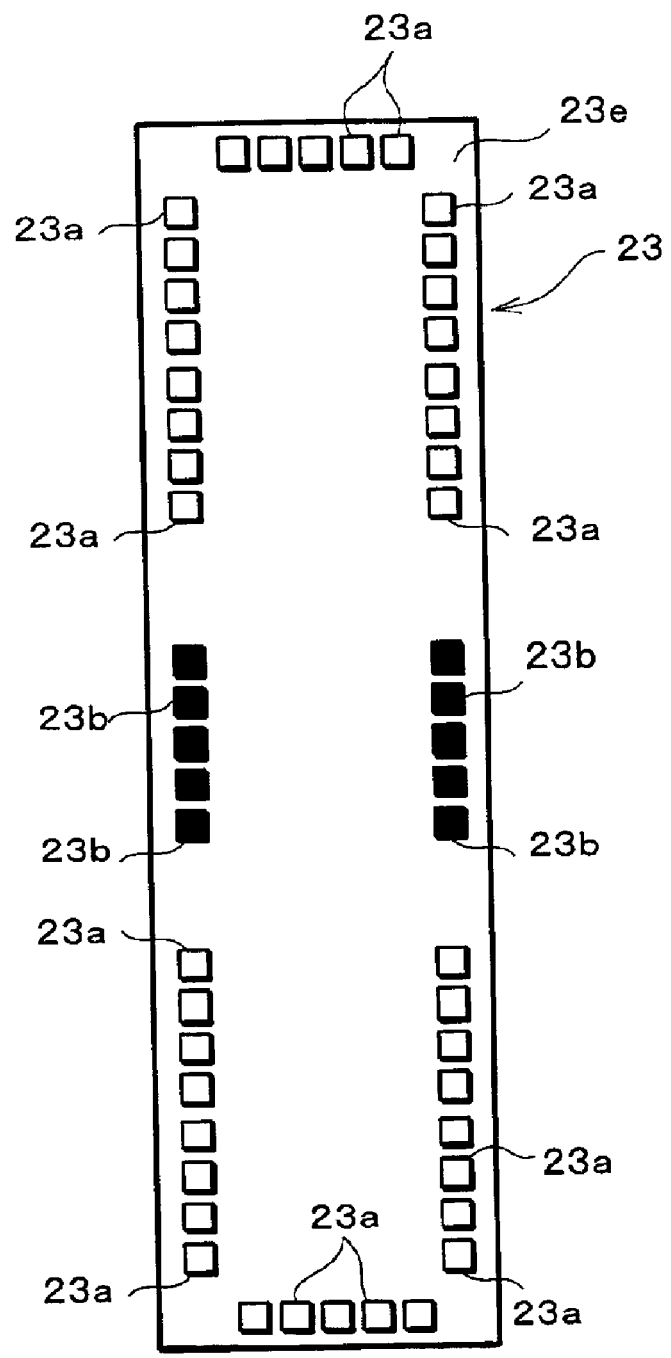
FIG. 5 is a plan view showing another arrangement of bumps on the LSI chip.

To resolve the problem above, for instance, protrusions 23b which are more or less flush with the bumps 23a are provided in the middle of the mounting face 23e of the LSI chip 23, as FIG. 5 shows. The protrusions 23b are provided along the middle parts of the longer sides of the LSI chip 23. The protrusions 23b are made of a non-conductive material and hence not to be short-circuited with the wires on the film base 22.

Providing the protrusions 23b makes it possible not only to spread the resin uniformly but also to reduce the stress generated in the LSI chip 23 when the same is mounted, thus it is possible to prevent warpage of the LSI chip 23 due to the stress. It has been pointed out that warpage of an LSI chip could change a characteristic thereof, and especially a change of a characteristic of an analog circuit is thought to be problematic. A thinner LSI chip suffers more damage from this, so taking a increase of a demand for a thinner LSI chip in the future into account, preventing warpage of the LSI chip as above is preferable.

Moreover, the resin layer 34, formed by injecting and hardening the resin after the mounting of the LSI chip 23, supports the middle part of the LSI chip 23 as a spacer on the film base 22, and hence the LSI chip 23 does not suffer warpage under its own weight. In other words, the LSI chip 23 is fixed with the resin layer 34 in the condition when the chip is mounted.

By the way, it is preferable to arrange a pitch (arrangement intensity) of the protrusions 23b substantially equal to that of the bumps 23a, to spread the resin uniformly.

Figure 6:
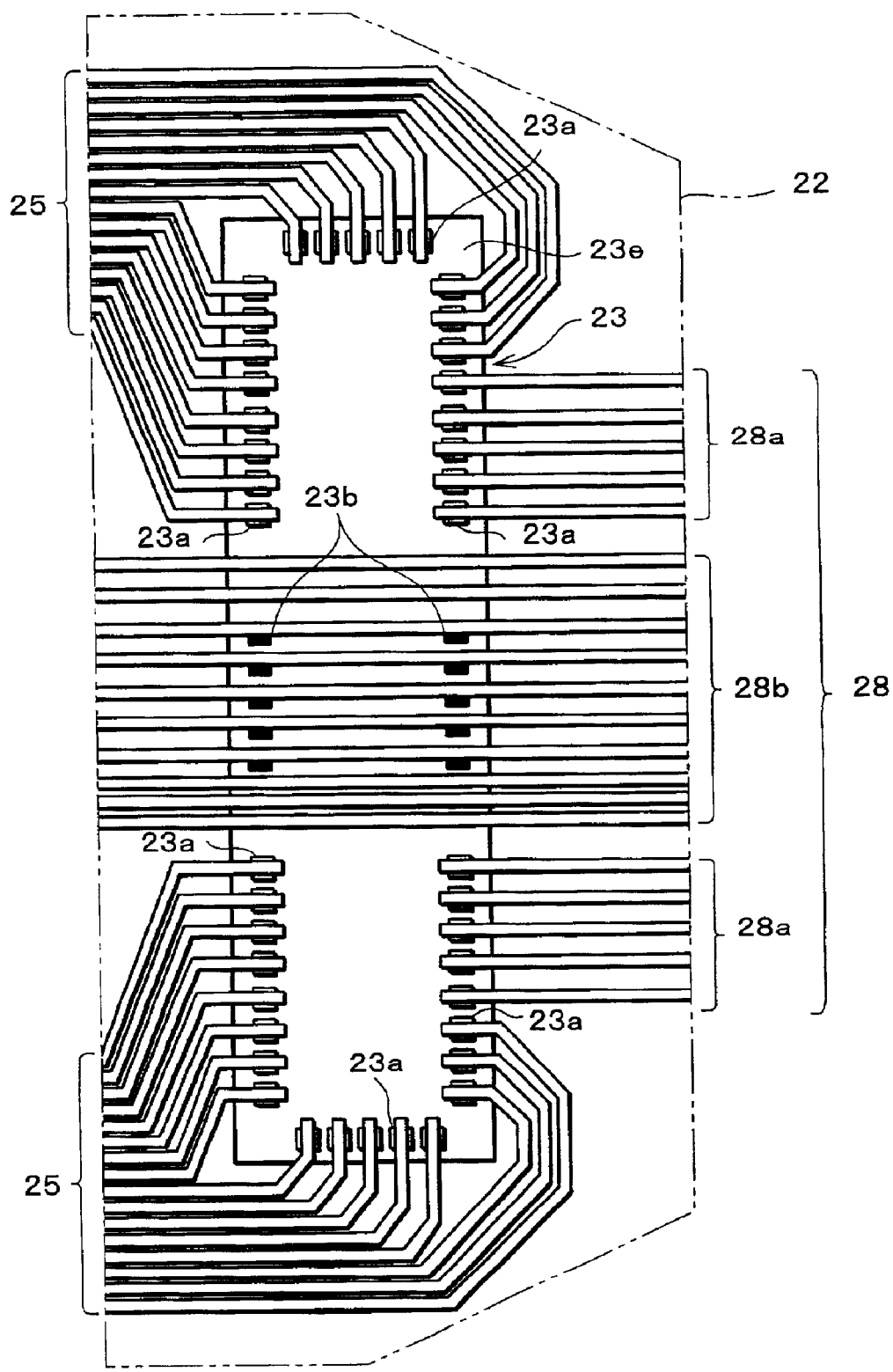
FIG. 6 is a plan view showing an arrangement of wires connected to the LSI chip including protrusions.

FIG. 6 indicates an arrangement of wires connected to the LSI chip 23 including the protrusions 23b. The set of wires 28 connected to the group 27 of connecting terminals includes a signal wire for the control signal CTL provided to the LSI chips 23 and 24 and power supply wires for inputting the aforementioned voltages. Among the wires, the first set of wires 28a is connected to the connecting electrodes (bumps 23a) of the LSI chip 23 whereas the second set of wires 28b passes under the LSI chip 23 so as to be connected to the LSI chip 24. The mounting face 23e of the LSI chip 23 does not have any conductive connecting electrodes on the area where the second set of wires 28b passes across so that the second set of wires 28b, an internal circuit of the LSI chip 23 etc. are not short-circuited with each other since such connecting electrodes do not exist.

The protrusions 23b are provided with distance from the wires connected to the LSI chip 24 so as not to make contact with the wires, when the LSI chip 23 is mounted on the film base 22. Moreover, the protrusions 23b are made of a non-conductive material so that the protrusions 23b are not short-circuited, etc. even if the same make contact with the wires.

By the way, although the protrusions 23b are provided on the LSI chip 23 in advance here, the same may be provided on the film base 22 in advance.

Figure 7:
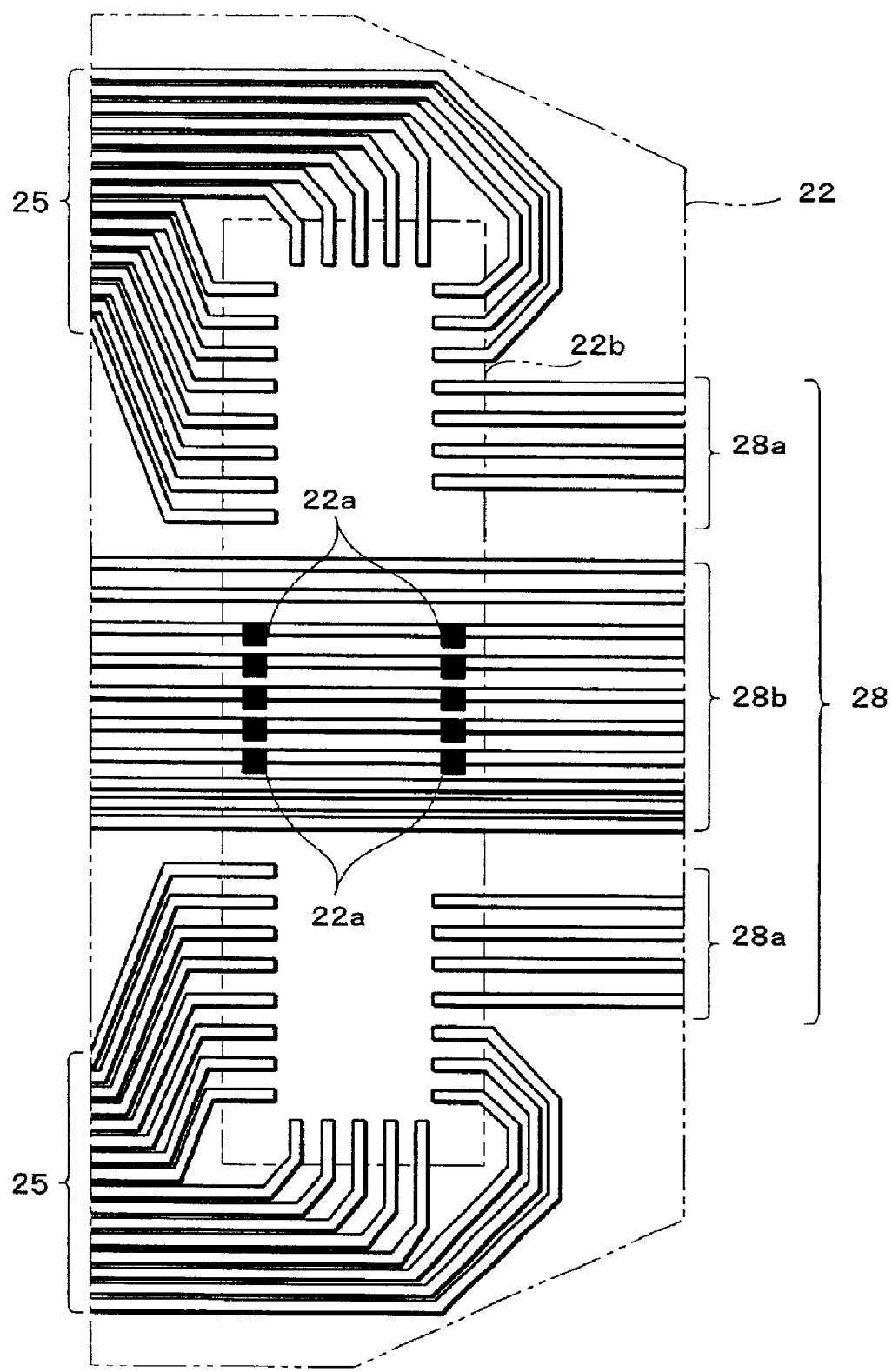
FIG. 7 is a plan view showing an arrangement of the film base including protrusions.

For instance, as FIG. 7 shows, protrusions 22a are provided on a mounting area 22b of the film base 22 on which area the LSI chip 23 is mounted. The protrusions 22a are provided along the middle part of the longer side of the mounting area 22b. When the LSI chip 23 is mounted, the film base 22 is fixed on a flat supporting base so that the protrusions 22a suppress the stress generated in the LSI chip 23. Thus the warpage of the LSI chip 23 can be prevented as in the arrangement in which the protrusions 23b are provided on the LSI chip 23.

The two sets of wires 25 surround the opposing sides of the LSI chip 23 so as to be connected to the same in advance, as shown in FIG. 6. On this account, the sets of wires 25 are provided along the edges of the opposing sides of the film base 22 as shown in FIG. 1, and connected to scanning line electrode input terminals which face each other on the liquid crystal panel 1, as described above.

An arrangement of wires to the LSI chip 24 is identical with the conventional arrangement and thus omitted.

The layout of the bumps 23a on the LSI chip 23 and the wiring pattern on the film base 22 are not particularly limited to the arrangement shown in FIG. 6 so that the bumps 23a and the wiring pattern may be, for instance, arranged as shown in FIGS. 8 to 11.

Figure 8:
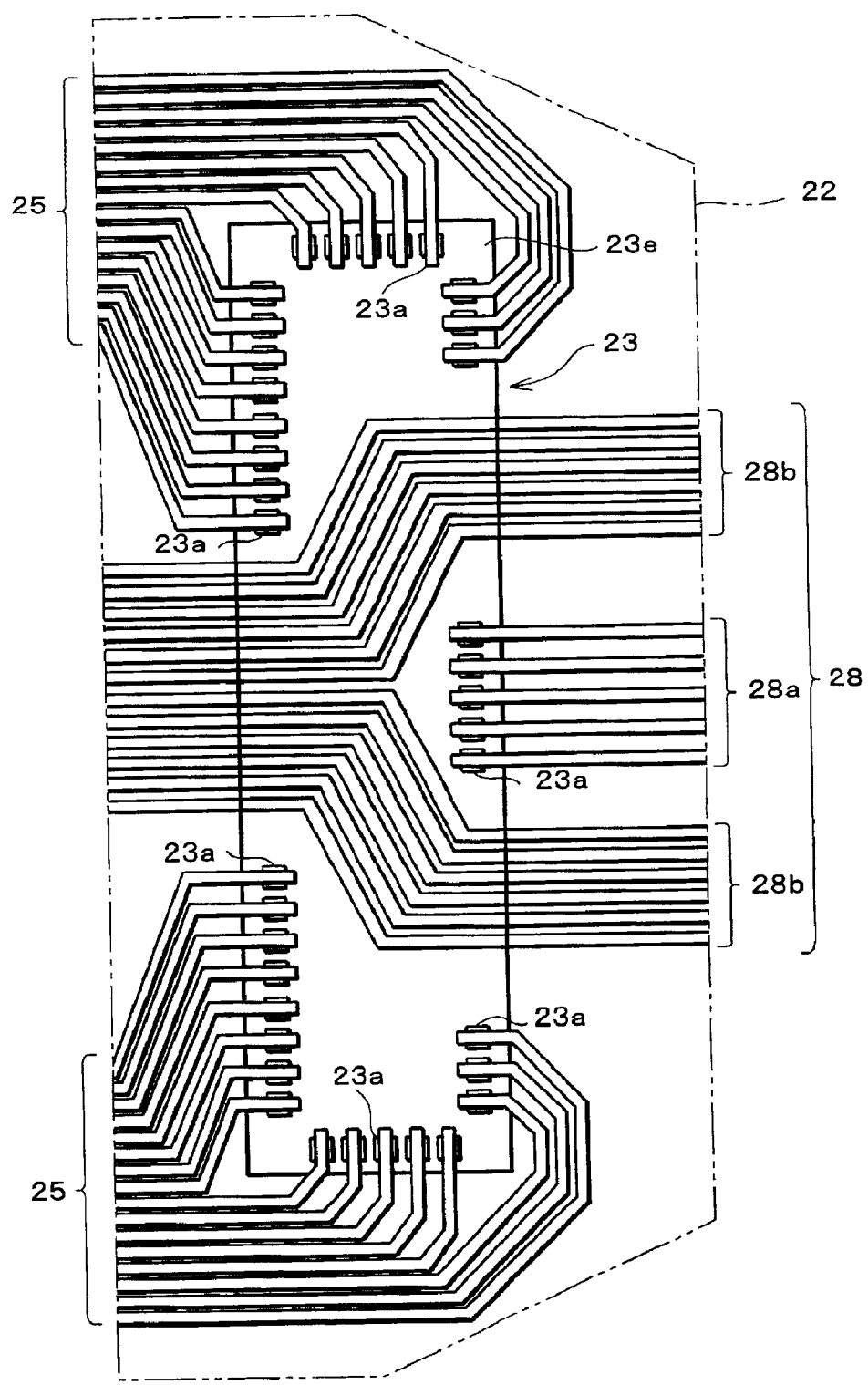
FIG. 8 is a plan view showing an arrangement of wires connected to the LSI chip not including protrusions.

In the arrangement shown in FIG. 8, the bumps 23a to which the first set of wires 28a to be input wires for the LSI chip 23 are connected are all provided along the edge of the middle part of the input side of the LSI chip 23. In the meantime, two sets of the second set of wires 28b are provided on the both sides of the first set of wires 28a, but on the middle part of the LSI chip 23 on which the first set of wires 28a is not provided, the two sets of the second set of wires 28b are joined together.

On this account, unlike the arrangement in which the two sets of the first set of wires 28a are provided on the both sides of the second set of wires 28b, the first set of wires 28a is all provided on the middle part of the LSI chip 23 in this arrangement. Moreover, the protrusions 23b included in the LSI chip 23 shown in FIG. 6 are unnecessary in this arrangement, since the bumps 23a are provided on the middle part of the LSI chip 23.

Figure 10:
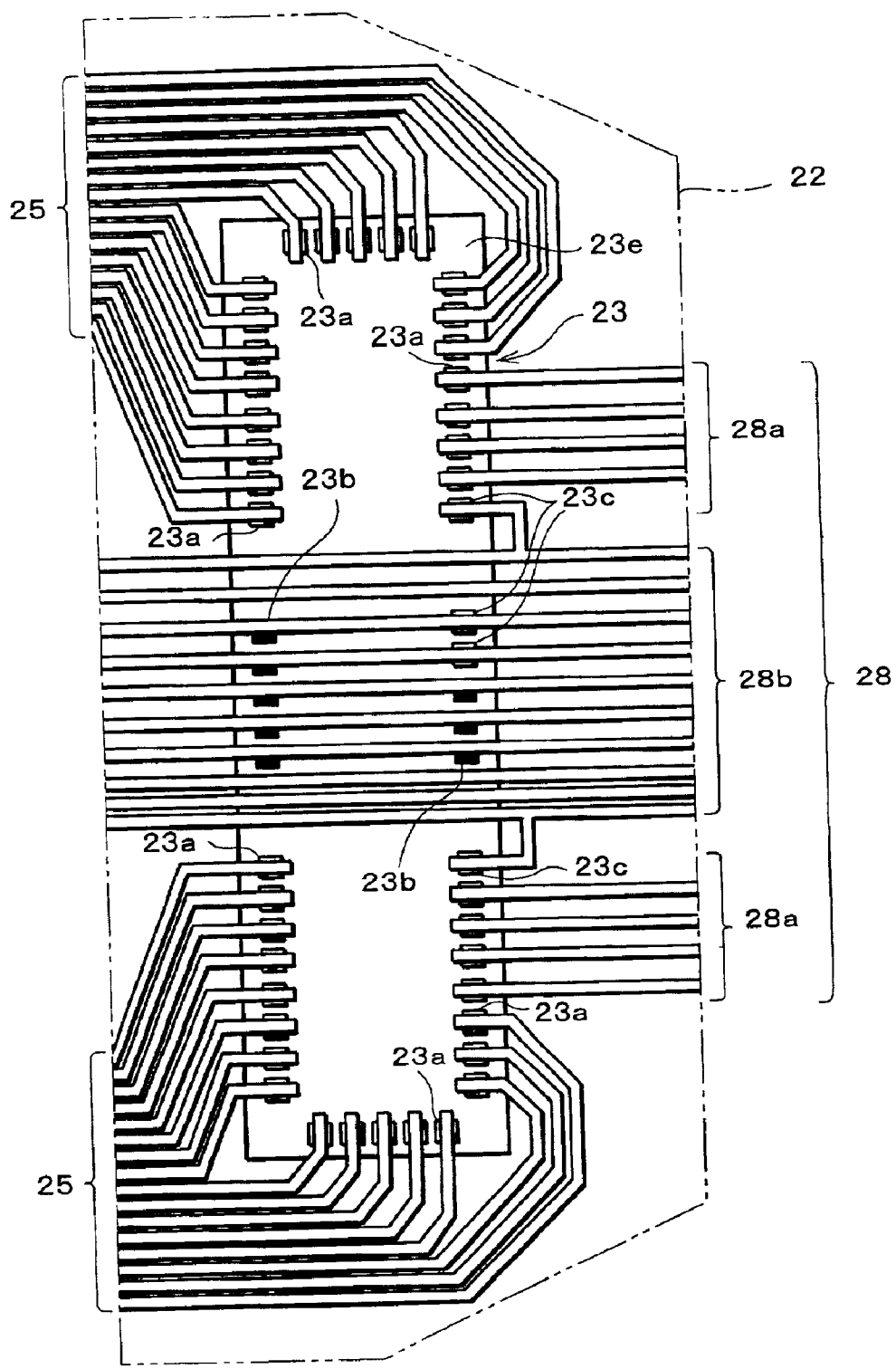
FIG. 10 is a plan view showing an another arrangement of wires connected to the LSI chip including protrusions.
Figure 11:
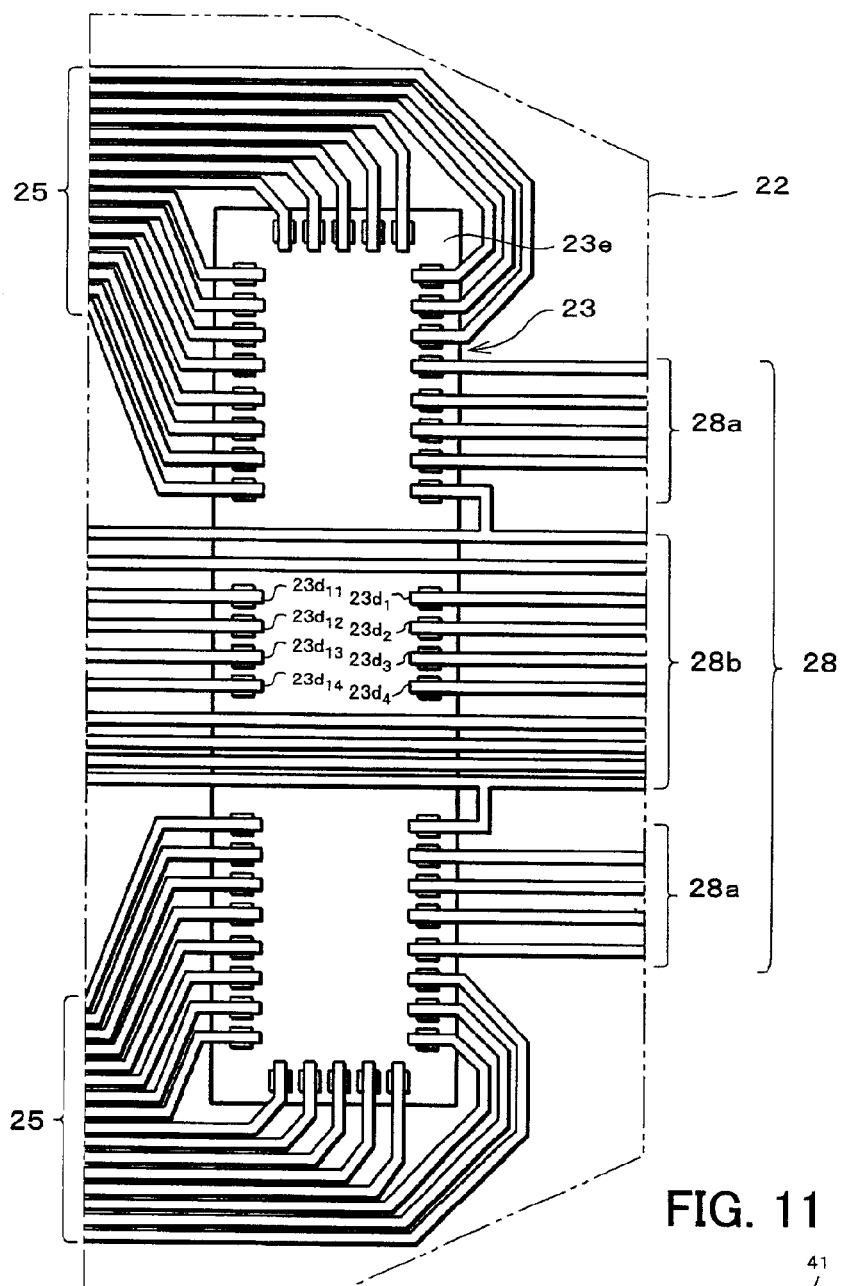
FIG. 11(a) is a plan view showing an arrangement of wires connected to the LSI chip in which various circuits are provided.
FIG. 11(b) is a block diagram showing arrangements of the circuits.
Figure 11:
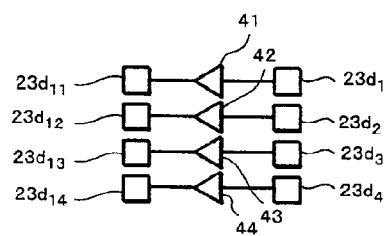
Figure 12:
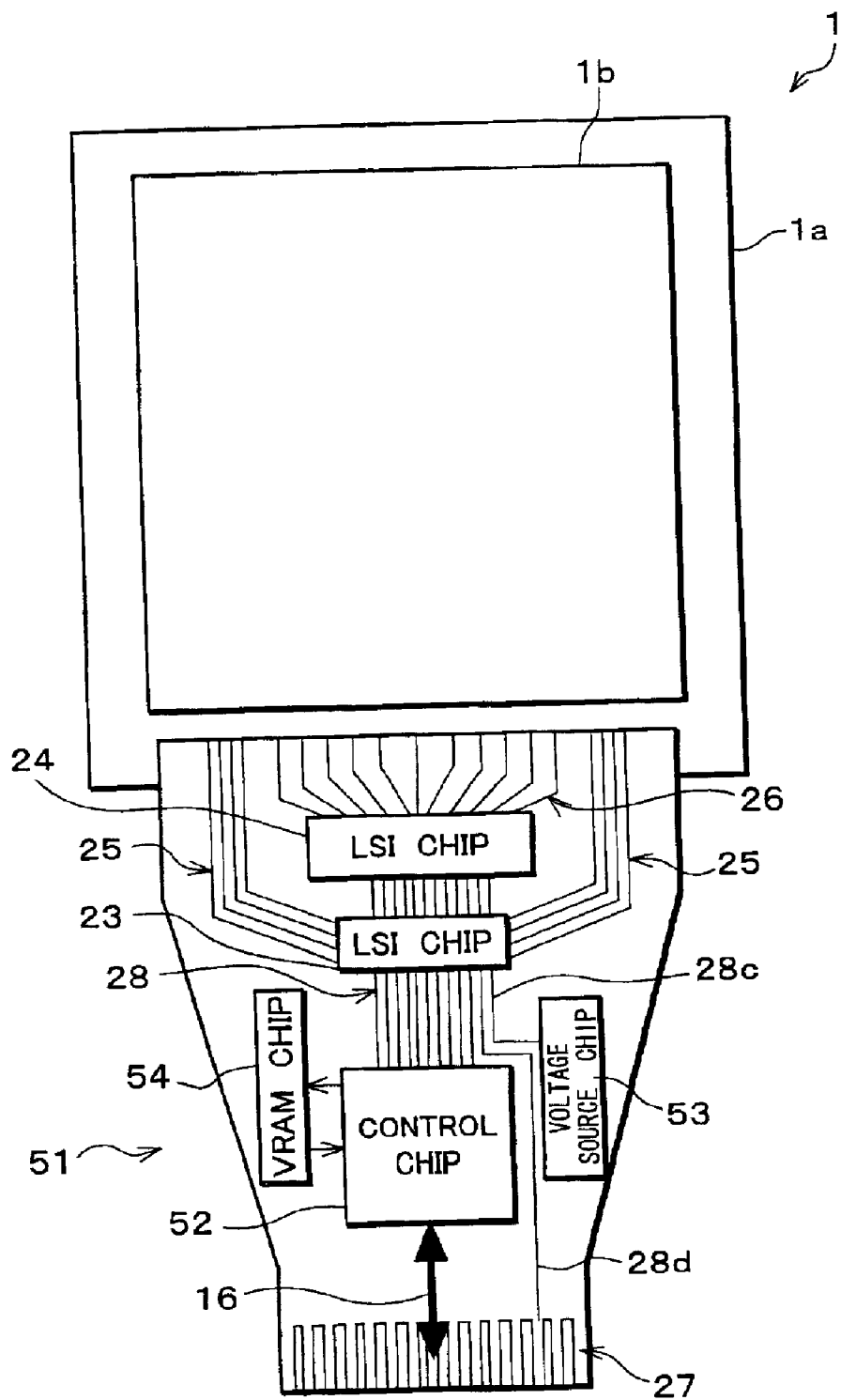
FIG. 12 is a plan view showing a liquid crystal panel and an arrangement of a mounting package attached to the same in accordance with a liquid crystal module of another embodiment of the present invention.
Figure 13:
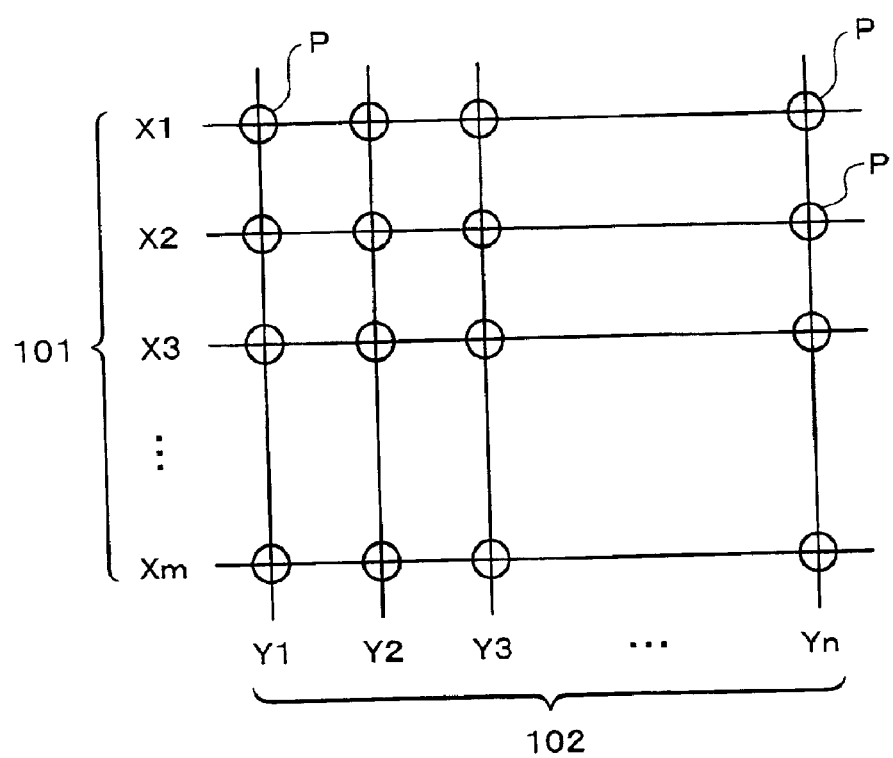
FIG. 13 is a plan view showing an arrangement of a main part of a conventional matrix-type liquid crystal display panel.
Figure 14:
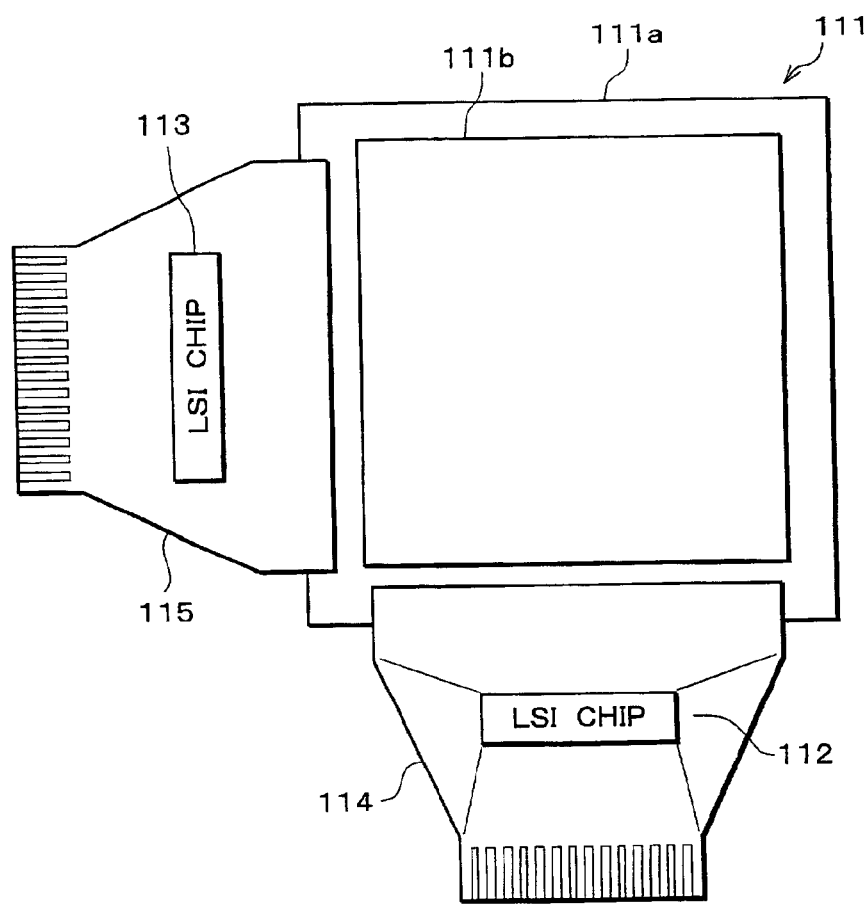
FIG. 14 is a plan view showing an arrangement in which a drive LSI chip is mounted on a glass substrate of a liquid crystal panel by a TCP.
Figure 15:
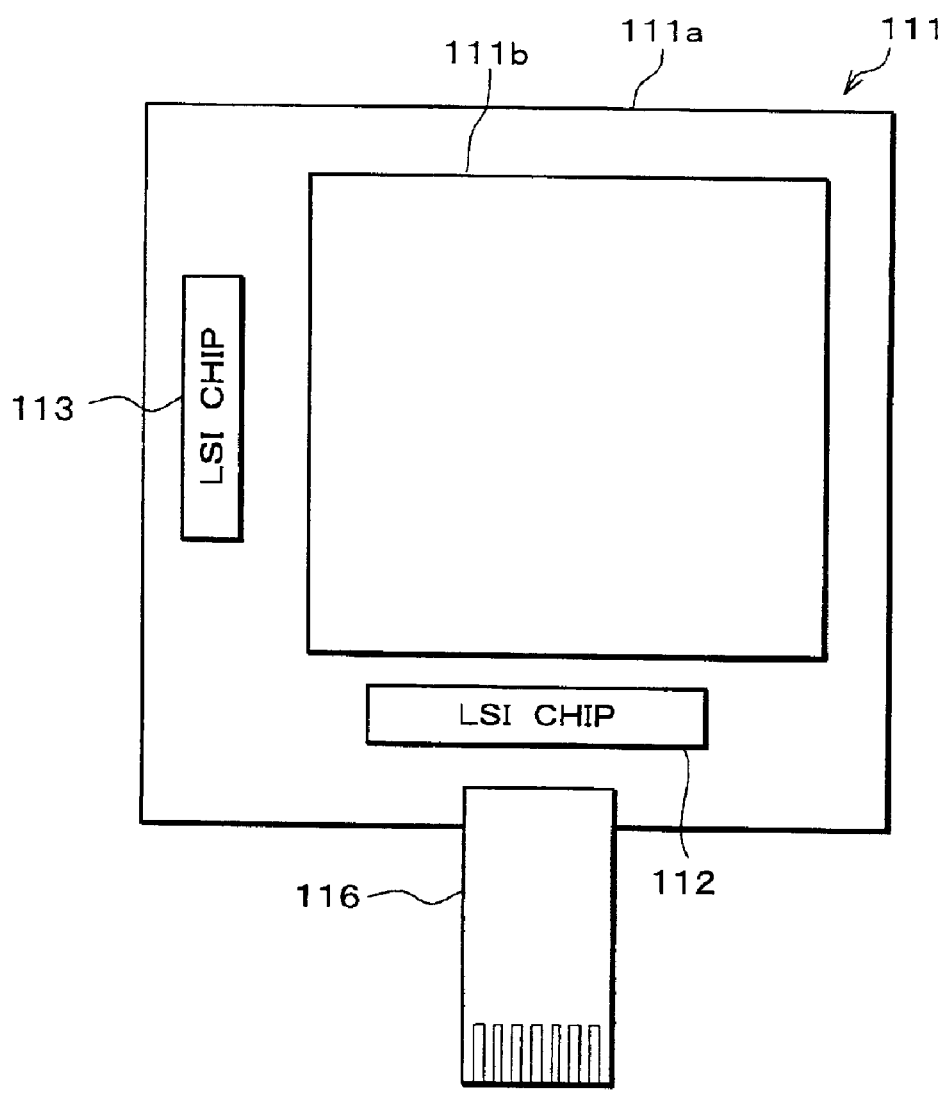
FIG. 15 is a plan view showing an arrangement in which the drive LSI chip is directly mounted on the glass substrate of the liquid crystal panel by a COG technique.
Figure 16:
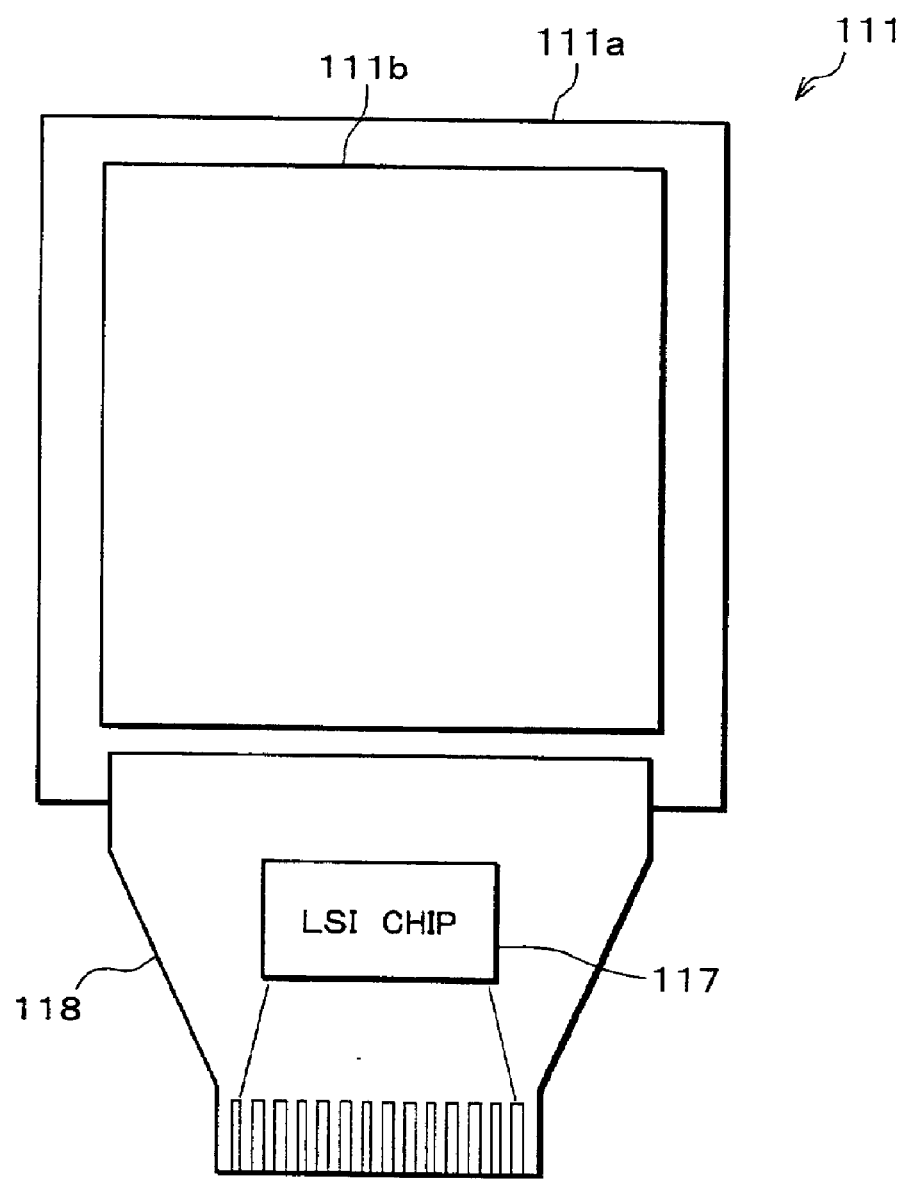
FIG. 16 is a plan view showing an arrangement in which more than one drive LSI chip are mounted on the glass substrate of the liquid crystal panel by the TCP.
Figure 17:
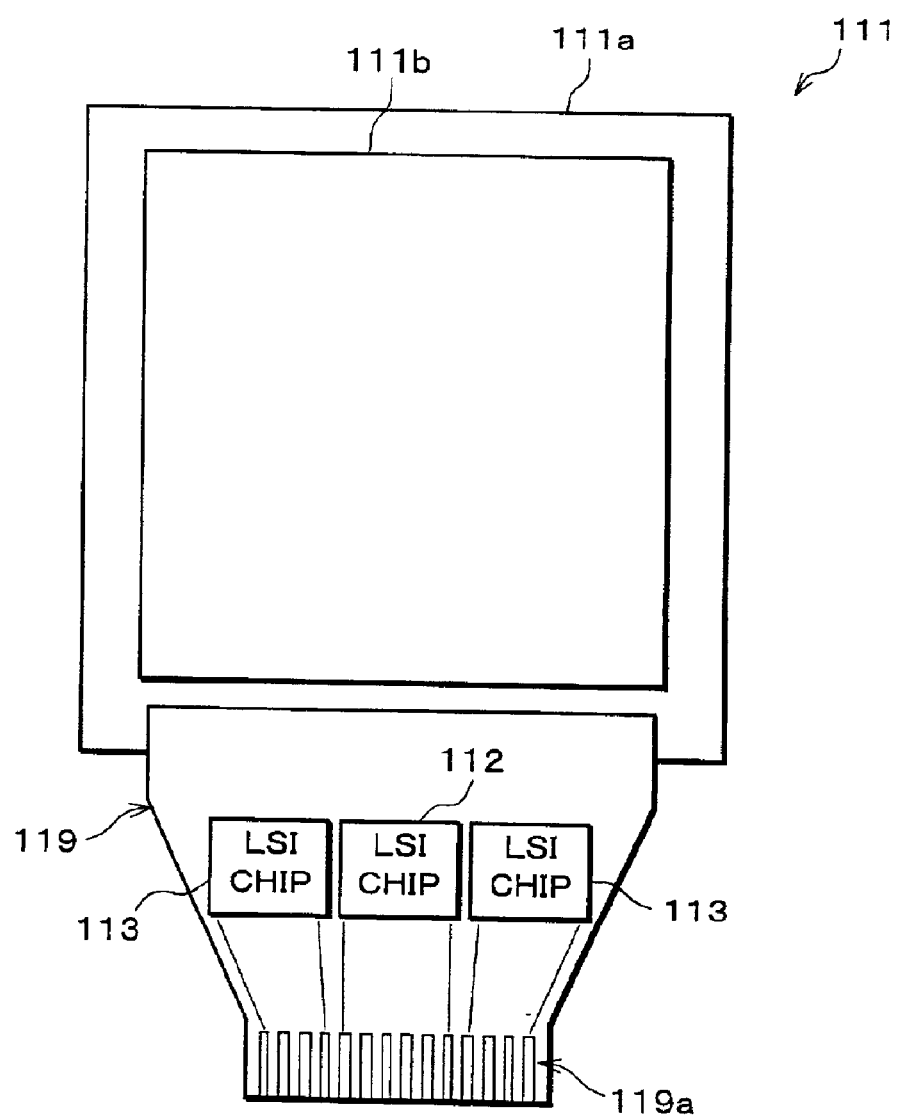
FIG. 17 is a plan view showing an arrangement in which the single drive LSI chip is mounted on the glass substrate of the liquid crystal panel by the TCP.
Figure 18:
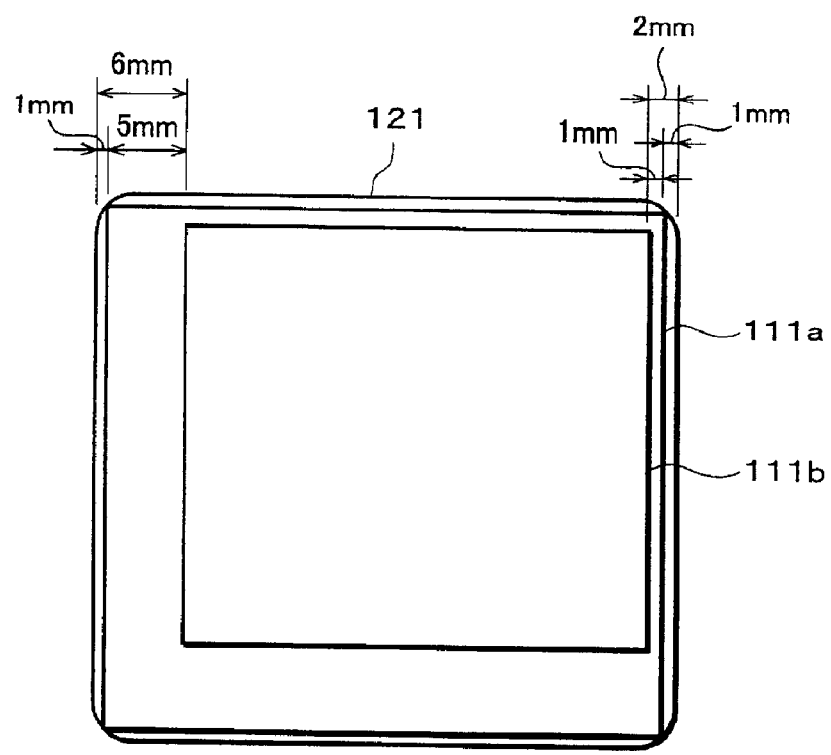
FIG. 18 is a front view showing an arrangement in which a display area, whose left margin with respect to a liquid crystal panel arranged as shown in FIG. 15 is not equal to the right margin thereof, is provided on the panel.
Figure 19:
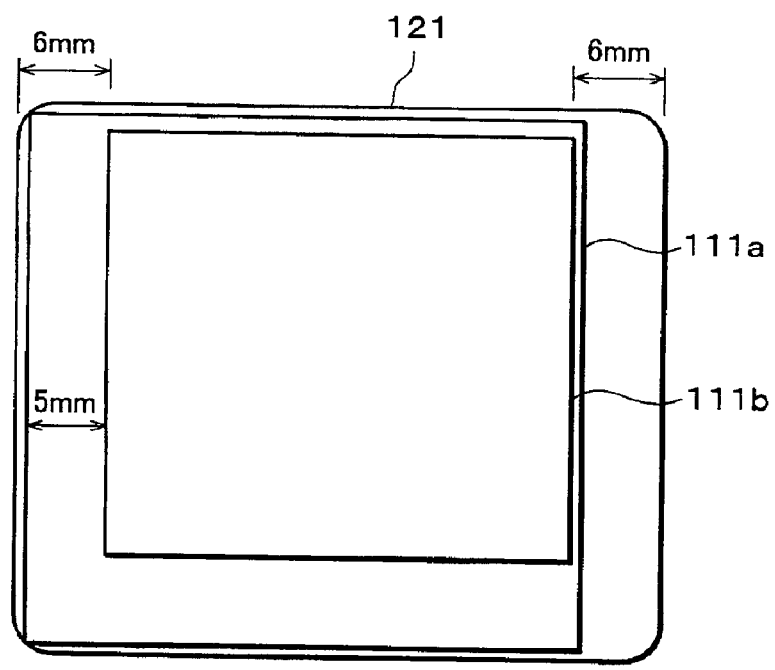
FIG. 19 is a front view showing an arrangement in which the display area, whose left margin with respect to the liquid crystal panel arranged as shown in FIG. 15 is equal to the right margin thereof, is provided on the panel.

Although the wires in FIG. 6 are illustrated linearly, as described above, the power supply wires (Vcc, Vss, Vdd, and V0 to V5) etc. provided commonly in the LSI chips 23 and 24 have branches to be connected to the LSI chips 23 and 24 (see FIG. 10).

Figure 9:
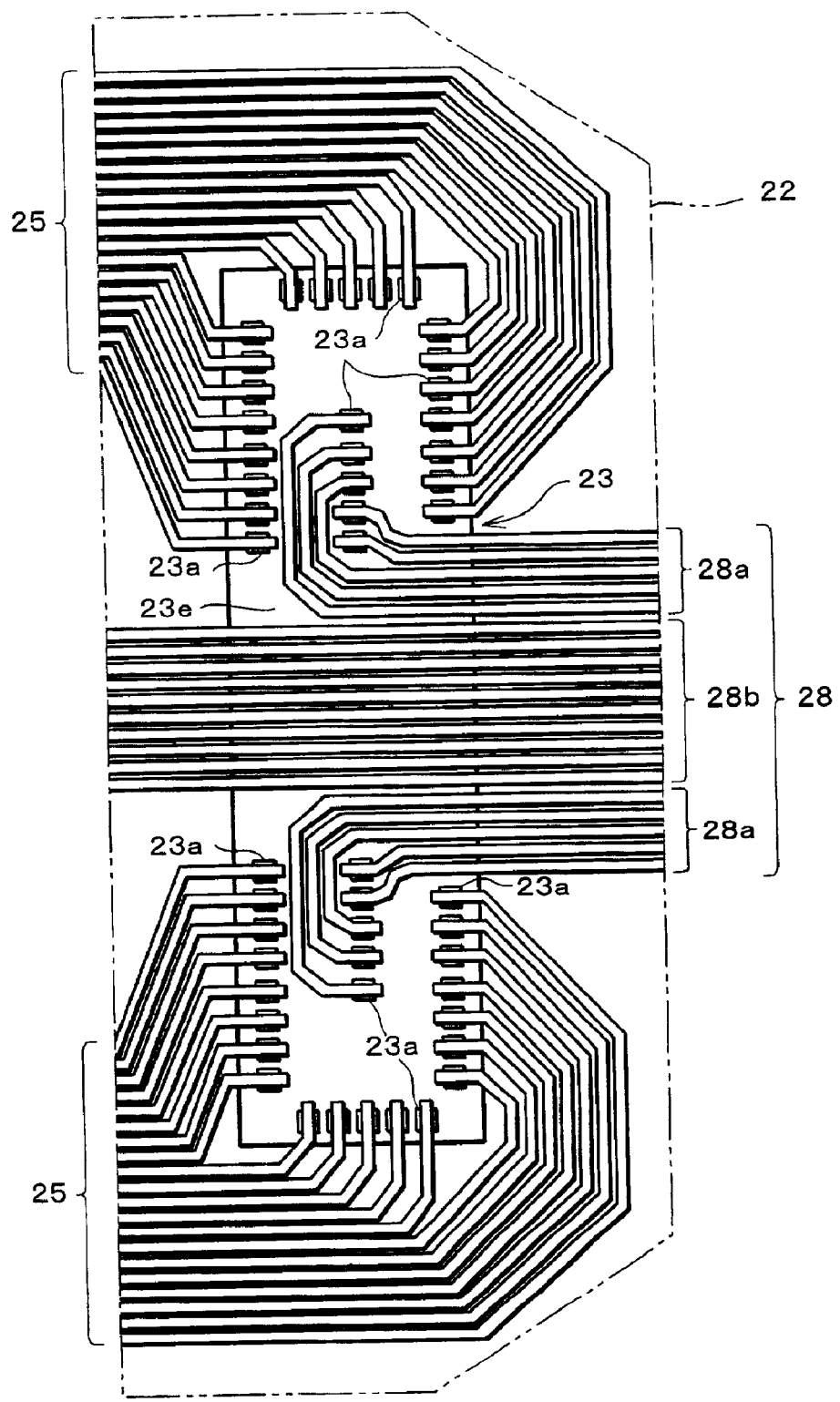
FIG. 9 is a plan view showing another arrangement of wires connected to the LSI chip not including protrusions.

In an arrangement shown in FIG. 9, the bumps 23a for connecting the first set of wires 28a, which is input/output wire of the LSI chip 23, are provided not along the edges of the longer sides of the LSI chip 23 as in the arrangement in FIG. 6 but in the middle of the LSI chip 23, more specifically between the rows of the bumps provided along the edges of the longer sides of the LSI chip 23. In this arrangement it is possible to reduce lengths of the longer sides of the LSI chip 23 so as to reduce the area of the LSI chip 23.

The protrusions 23b may be provided on the LSI chip 23 of this arrangement too.

In an arrangement shown in FIG. 10, common wires for both of the LSI chips 23 and 24 can be connected to the LSI chip 23. More specifically, the LSI chip 23 includes bumps 23c on the mounting face 23e, which are connected to wires branched off from particular wires (such as a power supply wire) among the second set of wires 28b. The bumps 23c are provided along with the bumps 23a to which the first set of wires 28a are connected, and at the same time the bumps 23c are provided to be far from the second set of wires 28b to avoid short-circuit. The bumps 23c may be provided where the second set of wires 28b passes through. If the bumps 23c are provided in this area, it is unnecesary to make the wires branch off from the second set of wires 28b as above.

An arrangement shown in FIG. 11(a) is preferably used for the mounting package 21 in which circuits such as a buffer, an amplifier, and a level shifter are provided for interpolation, amplification, impedance conversion, and level shift, etc. of a signal which is damped during transmission from other LSIs. Other unillustrated LSIs including the LSI chip 24 may include similar circuits and have a similar arrangement of bumps to be discussed later.

In this arrangement, the LSI chip 23 includes bumps $23d_1$ to $23d_4$ and bumps $23d_{11}$ to $23d_{14}$ for connecting the second set of wires 28b. Moreover, as FIG. 11(b) shows, internal circuits 41 to 44, which are processing circuits including a buffer, an amplifier, and a level shifter, etc. for variously processing an input signal transmitted to the LSI chip 24, are provided in the LSI chip 23. Input terminals of the internal circuits 41 to 44 are respectively connected to the bumps $23d_1$ to $23d_4$, whereas output terminals thereof are respectively connected to the bumps $23d_{11}$ to $23d_{14}$.

It is unnecessary to independently provide a circuit on the film base 22, which signal is for treating a signal transmitted in the second set of wires 28b, so that the area of the mounting package 21 can be further reduced.

Incidentally, although each of the internal circuits 41 to 44 individually gives a predetermined of treatment to four signals in the arrangement above, as long as at least one signal is treated, the numbers of signals to be treated are not particularly limited.

As a concrete example of the liquid crystal panel 1, a panel also including 128 (data side)×3 (R, G, and B)×164 (scanning side) pixels as in the panel in Background of the Invention is described below.

The LSI chip 24 includes 384 (=128×3) terminals as output terminals, and transmits a driving signal to the liquid crystal panel 1 via the set of wires 26. The main control signals CTL to be transmitted to the LSI chip 24 are such as a data transmission clock signal, a start pulse signal, a latch signal, data for display, an AC conversion signal, and a brightness control signal, etc.

The data transmission clock signal is a clock signal for transmitting sets of the data for display to according R, G, and B in the shift register inside the LSI chip 24. The start pulse signal controls the start of the transmission. The latch signal latches a signal acquired as a result of the transmission of the data for display in one horizontal synchronizing period. The AC conversion signal converts the data signal transmitted from the LSI chip 24, which is for driving a liquid crystal with AC, into AC. The brightness control signal controls a voltage level of the data signal, to adjust the brightness of the display.

Moreover, as described above, the supply voltage Vcc, the reference voltage Vss, the boosted supply voltage Vdd, and the voltages V0, V2, V3, and V5 (see FIG. 2) to be applied to the liquid crystal panel 1 are provided for the LSI chip 24.

Generally an LSI chip for driving a data line electrode such as the LSI chip 24 has a very narrow rectangular shape since the chip has a lot of outputs and a few inputs. Thus in the LSI chip the output terminals are provided along the longer side of the chip which side is close to the liquid crystal panel 1, the shorter sides, and a part of the other longer side, whereas terminals for an input signal and power supply are provided along the other longer side.

In the meantime, main control signals transmitted to the LSI chip 23 are such as a transmission signal, a start pulse signal, and an AC conversion signal, etc. The transmission signal is a signal (such as a horizontal synchronizing signal) that transmits a scanning signal in the shift register inside the LSI chip 23. The start pulse signal controls the start of the transmission. The AC conversion signal converts the scanning signal, which is for driving a liquid crystal with AC, into AC.

Moreover, as described above, the supply voltage Vcc, the reference voltage Vss, the boosted supply voltage Vdd, and the voltages V0, V1, V4, and V5 (see FIG. 2) to be applied to the liquid crystal panel 1 are provided for the LSI chip 23.

Generally an LSI chip for driving a scanning line electrode such as the LSI chip 23 also has a lot of outputs and a few inputs as in the case of the LSI chip for driving the data line electrode so that the chip has a very narrow rectangular shape. Thus in the LSI chip the output terminals are provided along the longer side of the chip which side is close to the liquid crystal panel 1, the shorter sides, and a part of the other longer side, whereas terminals for input and output signals and power supply are provided along the other longer side.

In many cases the liquid crystal panel 1 has a lot of pixels aligned sideward (longitudinal direction of the scanning line electrode Y) and therein sets of the display data of each of R, G, and B are dealt with individually. On this account, the output terminals included in the LSI chip for driving the scanning line electrode are fewer than those in the LSI chip for driving the data line electrode.

Therefore, in the present embodiment it is possible to provide the two sets of wires 25 on the both right and left sides of the liquid crystal panel 1 with ease by providing the signal wire and power supply wire (the numbers of these wires may be relatively few), that are connected to the LSI chip 24, under the LSI chip 23. On this account, it is possible to implement the arrangement of wires allowing to be arranged the display area 1a in the middle of the liquid crystal panel 1 with ease. Moreover, two LSI chips 23 and 24 having narrow rectangular shape can be mounted side by side with the longer sides thereof confronting each other since the wires do not obstruct to implement this arrangement, and hence it is possible to mount LSI chips highly densely. Furthermore, related LSI chips (including related LSIs such as the control circuit 13) can be mounted on the film base 22 so that it is possible to further reduce the size of the liquid crystal module.

As described above, it is possible to simplify the routing of input signal wires by providing the second set of wires 28b passing under the LSI chip 23 (mounting area 22b), even if the LSI chips 23 and 24 are mounted on the single film base 22. Thus it is unnecessary to provide more than one LSI chip 23.

Moreover, it is possible to shorten the lengths of a high-speed data transmission clock wire and a high-speed data wire so that it is possible to prevent degradation of the quality of the display due to external noise, and also it becomes easy to design the arrangement of the display module. Also the power supply wire can be routed in a short distance. On this account, it is possible to prevent degradation of the quality of the display due to noise entering into the power supply wire.

As described above, it becomes easy to design the arrangement of wires connected to the film base 22 due to the simplified routing of the wires. Coupled with the high density mounting of the LSI chips 23 and 24, this reduces the area of the film base 22 and cuts the cost of the mounting package 21.

Furthermore, the simplification of the routing of the wires makes it possible to provide the wires in a single layer or on the both sides of the chip so that the film base 22 no longer requires more than one layer. On this account, it is possible to design the display module with ease and the same can be manufactured in a smaller size, since the film base 22 is thin enough so as to have flexibility. This arrangement is especially useful for mobile devices such as a mobile phone that particularly requires down-sizing, weight-reduction and cost-cutting.

The arrangement of wires between the LSI chips 23 and 24 becomes simple so that mounting and wiring the components other than the driving device become easy too. Particularly, passing wires are all arranged on the wiring area so that it is unnecessary to connect terminal electrodes of the LSI chip 23 to that of the LSI chip 24 and the input wires can be provided separately from the output wires. Thus the wires can be routed in the shortest distance and the wiring can be arranged easily, and it is possible to provide the display panel 1 in which peripheral devices are mounted on the single film base 22, so that the manufacturing process of the display module can be dramatically simplified and reliability thereof is improved.

The following description will discuss another embodiment in accordance with the present invention in reference to FIGS. 2, 3, and 6 to 12. By the way, members having the same functions as those described in the embodiment shown in FIG. 1 are given the same numbers, so that the descriptions are omitted for the sake of convenience.

A liquid crystal module in accordance with the present embodiment includes, as FIG. 2 shows, a liquid crystal panel 1, a common driver 11, a segment driver 12, a control circuit 13, a voltage generating circuit 14, a VRAM 15, etc., as in the liquid crystal module shown in FIG. 1. However, the liquid crystal panel 1 for the present liquid crystal module is connected not to the mounting package 21 shown in FIG. 1 but to a mounting package 51 shown in FIG. 12.

As in the case of the mounting package 21, the mounting package 51 also includes a film base 22 on which LSI chips 23 and 24 are mounted, sets of wires 25, 26, and 28, and a group 27 of connecting terminals. Moreover, a control chip 52 into which the control circuit 13, the voltage generating circuit 14, and the VRAM 15 are integrated, a voltage source chip 53, and a VRAM chip 54 are further mounted on the film base 22 of the mounting package 51.

A system bus 16 formed on the film base 22 connects the control chip 52 to the group 27 of connecting terminals. The set of wires 28 includes a voltage wire 28c connected to the voltage source chip 53 and a power supply wire 28d connected to the group 27 of connecting terminals. The voltage wire 28c is provided to apply the aforementioned voltages V0 to V5 generated in the voltage source chip 53 to the LSI chips 23 and 24. The power supply wire 28d is provided to apply the supply voltage Vcc, the reference voltage Vss, and the boosted supply voltage Vdd supplied from the outside to the LSI chips 23 and 24.

In the mounting package 51 arranged as above, a second set of wires 28b on the film base 22 is also provided to pass under the LSI chip 23 using a COF technique shown in FIGS. 3(a) and (b), as in the mounting package 21 shown in FIG. 1. On this account, it is possible to prevent each wire included in the set of wires 28b disconnected, as in the mounting package 21.

Needless to say, in this embodiment, the connection between the LSI chip 23 and the set of wires 28 is arranged as shown in FIGS. 6 to 11 as in the embodiment shown in FIG. 1.

Although the example of the arrangement of electrodes on the liquid crystal panel 1 described in the present embodiment and the embodiment shown in FIG. 1 is a simple matrix type, the electrodes on the liquid crystal panel 1 may be differently arranged. For instance, when the liquid crystal panel 1 is TFT type, the common driver 11 and the segment driver 12 in FIG. 2 are respectively replaced by a gate driver and a source driver, and hence the LSI chips 23 and 24 mounted on the mounting package 21 or 51 are also respectively replaced by an LSI chip into which the gate driver is integrated and an LSI chip into which the source driver is integrated.

Moreover, although the example of the arrangement of the bumps 23a allowing the second set of wires 28b to pass across the LSI chip 23 is described in these two embodiments, the arrangement is not particularly limited to this example. Thus, for instance, there may be other ways to arrange the bumps to secure the wiring space on an LSI by developing alternative arrangements of the chips and wires on the film base 22.

In a liquid crystal module adopting a panel structure in which two groups 3 of data line electrodes are provided respectively above and below the liquid crystal panel 1, the mounting packages 21 or 51 may be provided respectively upper and lower sides of the liquid crystal panel 1, when the liquid crystal panel 1 is a STN liquid crystal panel. Moreover, the LSI chip 24 may be made up of cascaded LSI chips.

Although those two embodiments describe the example in which the liquid crystal panel 1 is used as the display panel, the aforementioned arrangement can be applied to any kind of display panel as long as the same is driven by a drive LSI chip similar to that of the LSI chips 23 and 24.

Furthermore, those two embodiments can effectively be used in a multi-terminal display module in which the display panel 1 on which electrodes are provided in a matrix manner is driven by an X-axis driver (common driver) and a Y-axis driver (segment driver) and these drivers are mounted on an insulating film base including wires.

The display element driving apparatus is preferably arranged so that the mounting substrate includes output wires connecting the second integrated circuit to the display element, the output wires are provided so as to pass by both sides of the first integrated circuit from both ends of the second integrated circuit, and the connecting wires are provided to pass an area between the both ends of the second integrated circuit. In this arrangement the output wires from the second integrated circuit to the display element is provided to pass by the both sides of the first integrated circuit from the both ends of the second integrated circuit, and hence no output wire is provided between the second integrated circuit and the first integrated circuit. Thus it is possible to provide the connecting wires in the area where no output wire is provided, by providing the connecting wires to pass between the both sides of the second integrated circuit. On this account, it is possible to provide the connecting wires and the output wires in the shortest distances and further reduce the cost of the display element driving apparatus.

The display element driving apparatus is preferably arranged so that the second integrated circuit includes connecting electrodes providing an external electrical connection and located in an area of a mounting face for the second integrated circuit other than areas where the connecting wires pass through. There is no connecting electrode on the passing area for the connecting wires in this arrangement so that the connecting wires, passing across the mounting area for the second integrated circuit, do not contact the connecting electrodes. Thus it is possible to enhance reliability of the display element driving apparatus by eliminating unnecessary short-circuit.

Moreover, in the arrangement above it is preferable that the second integrated circuit includes non-conductive protrusions, provided on the passing area of the connecting wires, which are substantially flush with the connecting electrodes. Alternatively, in the arrangement above it is preferable that the mounting substrate includes non-conductive protrusions, provided on the passing area of the connecting wires, which are substantially flush with the connecting electrodes. In these arrangements it is possible to eliminate local concentration of stress in the mounting substrate and thus the quality of the display element driving apparatus is improved.

The larger the second integrated circuit is, the more a part of the second integrated circuit in which the connecting electrode is not provided is vulnerable to an influence of stress, since the circuit is often formed to be a narrow rectangular shape because of the arrangement of the connecting electrodes thereon. So the local concentration of the stress can be eliminated by providing non-conductive protrusions, which are substantially flush with the connecting electrodes, on the passing area for the set of connecting wires.

It is preferable that each of the aforementioned display element driving apparatuses is arranged so that the second integrated circuit includes a processing circuit for giving a predetermined of treatment to at least one signal among signals passing through the connecting wires. It is unnecessary to provide the processing circuit independently on the mounting substrate in this arrangement, and thus it is possible to further reduce the cost of the display element driving apparatus.

The display includes the display element and any one of the aforementioned display element driving apparatuses so that it is possible to acquire the display having the advantage of any one of the display element driving apparatuses.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A display element driving apparatus, comprising:
    first and second integrated circuits for driving a display element having a plurality of first electrodes and a plurality of second electrodes which cross each other in a matrix manner, the first integrated circuit including a chip having an integrated first drive circuit for driving the first electrodes, and the second integrated circuit including a chip into which a second drive circuit for driving the second electrodes; and
    a single mounting substrate, including connecting terminals and connecting wires which connect the connecting wires which connect the connecting terminals and the first integrated circuit, for mounting the first and second integrated circuits such that the first integrated circuit is closer to the display element than the second integrated circuit between the connecting terminals and the display element,
    wherein the connecting wires are fixed in the substrate so as to pass through an mounting area of the second integrated circuit.

2. The display element driving apparatus as set forth in claim 1, wherein the mounting substrate includes output wires connecting the second integrated circuit to the display element, the output wires are provided so as to pass by both sides of the first integrated circuit from both ends of the second integrated circuit, and the connecting wires are provided to pass an area between the both ends of the second integrated circuit.

3. The display element driving apparatus as set forth in claim 1, wherein the second integrated circuit includes connecting electrodes providing an external electrical connection and located in an area of a mounting face for the second integrated circuit other than areas where the connecting wires pass through.

4. The display element driving apparatus as set forth in claim 3, wherein the connecting electrodes are provided on the both sides of the second integrated circuit.

5. The display element driving apparatus as set forth in claim 2, wherein the second integrated circuit includes connecting electrodes providing an external electrical connection and located in an area of a mounting face for the second integrated circuit other than areas where the connecting wires pass through.

6. The display element driving apparatus as set forth in claim 5, wherein the connecting electrodes are provided on the both sides of the second integrated circuit.

7. The display element driving apparatus as set forth in claim 3, wherein the second integrated circuit includes non-conductive protrusions, provided on the passing area of the connecting wires, which are substantially flush with the connecting electrodes.

8. The display element driving apparatus as set forth in claim 3, wherein the mounting substrate includes non-conductive protrusions, provided on the passing area of the connecting wires, which are substantially flush with the connecting electrodes.

9. The display element driving apparatus as set forth in claim 1, wherein the second integrated circuit includes a processing circuit for giving a predetermined of treatment to at least one signal among signals passing through the connecting wires.

10. The display element driving apparatus as set forth in claim 2, wherein the second integrated circuit includes a processing circuit for giving a predetermined of treatment to at least one signal among signals passing through the connecting wires.

11. The display element driving apparatus as set forth in claim 3, wherein the second integrated circuit includes a processing circuit for giving a predetermined of treatment to at least one signal among signals passing through the connecting wires.

12. The display element driving apparatus as set forth in claim 5, wherein the second integrated circuit includes a processing circuit for giving a predetermined of treatment to at least one signal among signals passing through the connecting wires.

13. The display element driving apparatus as set forth in claim 7, wherein the second integrated circuit includes a processing circuit for giving a predetermined of treatment to at least one signal among signals passing through the connecting wires.

14. The display element driving apparatus as set forth in claim 8, wherein the second integrated circuit includes a processing circuit for giving a predetermined of treatment to at least one signal among signals passing through the connecting wires.

15. The display element driving apparatus as set forth in claim 1, wherein the first electrode is a data line electrode via which a data signal is transmitted, and the second electrode is a scanning line electrode via which a scanning signal for selecting the second electrode is transmitted.

16. A display, comprising;
a display element including a plurality of first electrodes and a plurality of second electrodes crossing each other in a matrix manner; and
a display element driving apparatus including:
first and second integrated circuits for driving the display element having a plurality of first electrodes and a plurality of second electrodes which cross each other in a matrix manner, the first integrated circuit including a chip having an integrated first drive circuit for driving the first electrodes, and the second integrated circuit including a chip having an integrated second drive circuit for driving the second electrodes; and
a single mounting substrate, including connecting terminals and connecting wires which connect the connecting wires which connect the connecting terminals and the first integrated circuit, for mounting the first and second integrated circuits such that the first integrated circuit is closer to the display element than the second integrated circuit between the connecting terminals and the display element,
wherein the connecting wires are fixed in the substrate so as to pass through a mounting area of the second integrated circuit.

17. The display as set forth in claim 16, wherein:
the mounting substrate includes output wires connecting the second integrated circuit to the display element;
the output wires are provided to pass by both sides of the first integrated circuit from both ends of the second integrated circuit; and
the connecting wires are provided to pass an area between the both sides of the second integrated circuit.

18. The display as set forth in claim 16, wherein the second integrated circuit includes connecting electrodes providing an external electrical connection and located in an area of a mounting face for the second integrated circuit other than areas where the connecting wires pass through.

19. The display as set forth in claim 18, wherein the connecting electrodes are provided on the both ends of the second integrated circuit.

20. The display as set forth in claim 17, wherein the second integrated circuit includes connecting electrodes providing an external electrical connection and located in an area of a mounting face for the second integrated circuit other than areas where the connecting wires pass through.

21. The display as set forth in claim 20, wherein the connecting electrodes are provided on the both ends of the second integrated circuit.

22. The display as set forth in claim 18, wherein the second integrated circuit includes non-conductive protrusions, provided on the passing area of the connecting wires, which are substantially flush with the connecting electrodes.

23. The display as set forth in claim 18, wherein the mounting substrate includes non-conductive protrusions, provided on the passing area of the connecting wires, which are substantially flush with the connecting electrodes.

24. The display as set forth in claim 16, wherein the second integrated circuit includes a processing circuit for giving a predetermined of treatment to at least one signal among signals passing through the connecting wires.

25. The display as set forth in claim 17, wherein the second integrated circuit includes a processing circuit for giving a predetermined of treatment to at least one signal among signals passing through the connecting wires.

26. The display as set forth in claim 18, wherein the second integrated circuit includes a processing circuit for giving a predetermined of treatment to at least one signal among signals passing through the connecting wires.

27. The display as set forth in claim 20, wherein the second integrated circuit includes a processing circuit for giving a predetermined of treatment to at least one signal among signals passing through the connecting wires.

28. The display as set forth in claim 22, wherein the second integrated circuit includes a processing circuit for giving a predetermined of treatment to at least one signal among signals passing through the connecting wires.

29. The display as set forth in claim 23, wherein the second integrated circuit includes a processing circuit for giving a predetermined of treatment to at least one signal among signals passing through the connecting wires.

30. The display as set forth in claim 16, wherein the first electrode is a data line electrode via which a data signal is transmitted, and the second electrode is a scanning line electrode via which a scanning signal for selecting the second electrode is transmitted.

* * * * *